United States Patent [19]
Fujii

[11] Patent Number: 5,770,481
[45] Date of Patent: Jun. 23, 1998

[54] WIRING DESIGNING APPARATUS FOR AUTOMATICALLY DESIGNING LAYOUT OF INTEGRATED CIRCUIT AND WIRING DESIGNING METHOD THEREFOR

[75] Inventor: Takashi Fujii, Tokyo, Japan

[73] Assignee: NEC Corporation, Tokyo, Japan

[21] Appl. No.: 626,011

[22] Filed: Apr. 1, 1996

[30] Foreign Application Priority Data

Mar. 31, 1995 [JP] Japan .................................... 7-075716

[51] Int. Cl.$^6$ .................................................. H01L 21/00
[52] U.S. Cl. ............................................ 438/129; 438/14
[58] Field of Search ........................... 156/626.1, 656.1, 156/657.1; 216/13, 59, 75, 84, 100; 257/210, 211, 758, 760; 437/180, 182, 189, 195, 209, 978; 438/129, 18, 14

[56] References Cited

U.S. PATENT DOCUMENTS 4,974,048  11/1990  Chakravorty et al. ............. 437/180 X
5,264,390  11/1993  Nagase et al. ......................... 437/180
5,565,386  10/1996  Bearden et al. .................... 437/180 X

FOREIGN PATENT DOCUMENTS 4-167073   6/1992   Japan .

Primary Examiner—William Powell
Attorney, Agent, or Firm—Foley & Lardner

[57] ABSTRACT

A wiring designing apparatus and a wiring designing method is provided that comprise a wiring region setting unit for inputting a net list containing the nets for terminal connections and for setting a channel wiring region for wiring. A partial channel setting unit sets a partial channel region in the channel wiring region. A net selecting unit selects target nets for wiring designing from the net list, and a virtual terminal setting unit sets necessary virtual terminals on the boundaries of the partial channel region. A trunk allocating unit allocates the trunks of the selected nets to the wiring tracks in the partial channel region, and a wiring inhibited pattern updating unit outputs the wiring results after an update of the wiring inhibited pattern corresponding to the results of the trunk allocation by the trunk allocating unit. A net list updating unit updates the net list corresponding to the results of the trunk allocation by the trunk allocating unit.

12 Claims, 20 Drawing Sheets

WIRING DESIGNING APPARATUS FOR AUTOMATICALLY DESIGNING LAYOUT OF INTEGRATED CIRCUIT AND WIRING DESIGNING METHOD THEREFOR

BACKGROUND OF THE INVENTION

1. Field of the Invention

The present invention relates to a wiring designing apparatus for use in layout design of an integrated circuit and a wiring designing method therefor and, more particularly, to a wiring designing apparatus for automatically designing layout of an integrated circuit by using a calculator and a wiring designing method therefor.

2. Description of the Related Art

In layout design of integrated circuits, it is a common practice to conduct power supply wiring and clock wiring (hereinafter referred to as special wiring) processing prior to wiring processing for general signals (hereinafter referred to as general wiring). This is to meet such requirements in special wiring as minimization of wiring area through tapering of power supply wiring and reduction of clock skew of clock wiring. Because special wiring is conducted prior to general wiring, completed special wiring may exist in a channel wiring region when general wiring processing is conducted. The special wiring should be therefore treated as a wiring inhibited pattern (obstruction) for general wiring. When allocating trunks of a general wiring net in the channel wiring region, it is accordingly necessary to carry out the allocation while avoiding the wiring inhibited pattern.

Today, in general, layout of integrated circuits are done automatically and designed by a wiring designing apparatus using a computer. A conventional wiring designing apparatus, however, has difficulty in conducting channel wiring when an obstruction exists within a target wiring region. Wiring designing techniques, therefore, have been proposed which enable channel wiring even in a case where a wiring inhibited pattern, that is, an obstruction, exists within a target wiring region.

One of the conventional wiring designing techniques of this kind is recited in, for example, Japanese Unexamined Patent Publication (Kokai) No. 4-167073, entitled "Channel Wiring Processing Method". Disclosed in this literature, as will be described below, is a wiring designing technique applicable also to a case where a wiring inhibited pattern exists within a wiring region.

FIG. 21 is a flow chart showing a processing procedure of a channel wiring processing method recited in the above literature.

As shown in the figure, a locational restriction graph is firstly created which shows restrictions on upper-lower relationships in allocation among trunks allocated to a channel wiring region when they are to be allocated to wiring tracks (Step 2101). Here, the locational restriction graph is a graph representing trunks as trunk nodes and upper-lower relationships as oriented branches. When wiring tracks to be allocated to a certain trunk are limited by an obstruction existing in a wiring region, an obstruction node, representing an obstruction, and an oriented branch heading from this obstruction node toward the above-described trunk node, are added to the created locational restriction graph (Step 2102). In thus created locational restriction graph, the oriented branch (a, b) represents a restriction that the trunk "a" (or obstruction "a") should be allocated to a wiring track located above that for the trunk "b" (or obstruction "b").

Then, each node is weighted in the locational restriction graph (Step 2103). Here, the weight of a node representing a connection request is set to be a numeric value of "1" and the weight of an obstruction node is set to be the number of tracks to which trunks can not be allocated because of the obstruction.

Then, the order of the respective nodes is determined (Step 2104). First, a node that no oriented branch enters is set to be a starting point. Noting an arbitrary node, a sum of the values of the weights of all the nodes included in a route from the starting point to the noted node through oriented branches is taken as the order of the eyed node. The same procedure will be repeated thereafter to decide the order of all the nodes.

Next, existence/non-existence of a trunk is checked which is yet to be allocated to a wiring track and is, therefore, allocable (Step 2105). The following processing will be then repeated until wiring is completed with respect to all the trunks. First, out of trunks whose corresponding nodes are of the lowest order of the respective linkage components in the locational restriction graph, a trunk whose corresponding node is of the highest order is preferentially allocated to a track located as low as possible. Then, a trunk node corresponding to the said trunk is deleted from the locational restriction graph to update the same (Step 2106).

FIG. 22 is a schematic diagram showing one example of a channel wiring region for which wiring design is prepared.

In the illustrated example, four wiring tracks T1 to T4 are arranged between an upper boundary 161 and a lower boundary 162 in a channel wiring region, and a wiring inhibited pattern 163 is arranged bridging the tracks T2 and T3. In addition, terminals to be connected with each other, a terminal t1 in a cell column of the upper boundary 161 and a terminal t2 in a cell column of the lower boundary 162, are both located within a horizontal extent of the wiring inhibited pattern 163 to be hidden from each other.

For generating a net (n) to connect terminals t1 and t2 according to the above-described conventional wiring designing method under such conditions, a locational restriction graph is firstly created which shows restrictions on upper-lower relationships among trunks (Steps 2101, 2102). A locational restriction graph corresponding to the channel wiring region of FIG. 22 is shown in FIG. 23. As illustrated in the figure, there occurs a cycle, in the wiring example of FIG. 22, between a node (V) corresponding to the wiring inhibited pattern 163 and a node (n) corresponding to a trunk of a net (n) which connects the terminals t1 and t2.

Next, each node is weighted (Step 2103). The node (n) is weighted with "1". The weight of the node (V) is "2" equivalent to the number of tracks to which no trunk can be allocated due to the wiring inhibited pattern 163. Then, the order of the respective nodes in the locational restriction graph is determined according to the weights of these nodes (Step 2104). However, because the node (V) and the node (n) are cyclic as described above, no starting point is found and no order of the nodes is determined accordingly.

As described in the foregoing, the above conventional wiring designing method fails to allow wiring processing to be conducted when there exists a cycle between an obstruction and a net trunk in a locational restriction graph.

FIG. 24 is a schematic diagram showing another example of a channel wiring region for which wiring design is made.

In the illustrated example, three wiring tracks T1 to T3 are arranged between an upper boundary 181 and a lower boundary 182 in a channel wiring region, and two wiring inhibited patterns 185 and 186 are arranged bridging the tracks T2 and T3. The wiring inhibited pattern 185 is an obstruction only to a wiring layer for the wiring of trunks extending in the horizontal direction of the figure but not to a wiring layer for the wiring of connection branches extending in the vertical direction of the figure to connect trunks and terminals. On the other hand, the wiring inhibited pattern 186 is an obstruction to both of the above-described wiring layers for trunks and branches. Tracks to which no trunk can be allocated due to the wiring inhibited pattern 185 are two tracks T1 and T2. In a net (P)={p1, p2} which connects terminals p1 and p2, the terminal p1 is located right above the wiring inhibited pattern 185, on the upper boundary 181, while in a net (Q)={q1, q2} which connects terminals q1 and q2, the terminal q2 is located right below the wiring inhibited pattern 186.

When nets (P) and (Q) are generated which connect the respective terminals according to the above-described conventional wiring designing method under such conditions, the locational restriction graph created by Steps 2101 and 2102 of FIG. 21 and showing restrictions on upper-lower relationships among trunks will be such an effective graph as shown in FIG. 26 because no upper-lower restrictions exist between a trunk of the net (P) and that of the net (Q). In FIG. 26, a node corresponding to the wiring inhibited pattern 185 is represented as (W1), that corresponding to the wiring inhibited pattern 186 as (W2), that corresponding to the net (P) as (P) and that corresponding to the net (Q) as (Q).

Weights of the respective nodes given at Step 2103 of FIG. 21 are "2" for the node (W1) and "1" for the other three nodes (W2), (P) and (Q). The order of the nodes calculated at Step 2104 is as follows. The node (P) is "1" because it is a starting point. The node (Q), because of an oriented branch heading from the node (W2) toward the node (Q), is assigned "2" as a sum of the weight "1" of the node (W2) and the weight "1" of the node (Q).

A trunk of the net (Q) corresponding to the node (Q) is therefore allocated to the lowest-order track T3 at Step 2106. As a result, processing ends, with no allocable track existing for a trunk of the net (P) corresponding to the node (P). With reference to FIG. 25 showing the results of the wiring processing in this case, only the wiring between the terminals q1 and q2 in the net (Q) is allocated via the track T3, while wiring between the terminals p1 and p2 in the net (P) is impossible.

Thus, the above-described conventional wiring designing method has a problem that can occur where no trunk can be allocated to a net having terminals both in a cell column on an upper boundary, located right above a wiring inhibited pattern, and a cell column on a lower boundary, located right below the wiring inhibited pattern.

As described in the foregoing, because no consideration is given to the form of obstructions to wiring in practice generated by a wiring inhibited pattern in a channel wiring region, the conventional wiring designing method has drawbacks in that the number of trunks which can not be allocated to a track is increased so as to generate a net with wiring that is impossible to generate.

Moreover, in order to avoid generation of a net whose wiring is impossible to generate, the conventional method requires spare tracks to eliminate trunks whose wiring is yet to be completed, causing reduction of efficiency in using wiring tracks.

SUMMARY OF THE INVENTION

An object of the present invention is to overcome the above-described shortcomings of a conventional wiring designing method and to provide a wiring designing apparatus by which efficiency in using wiring tracks can be improved to realize efficient and appropriate net wiring and a wiring designing method therefor.

According to one aspect of the invention, a wiring designing apparatus for automatic designing of wiring layout on the integrated circuit comprising:

wiring region setting means for inputting a net list containing the nets for terminal connections and to set the channel wiring region for wiring;

partial channel setting means, according to certain rules, for setting the partial channel region containing no wiring inhibited pattern inside in the channel wiring region set by the wiring region setting means;

net selecting means for selecting target nets for wiring designing from the net list input by the wiring region setting means according to certain rules;

virtual terminal setting means for setting necessary virtual terminals on the boundaries of the partial channel region set by the partial channel setting means for the nets selected by the net selecting means according to certain rules;

trunk allocating means for allocating the trunks of the selected nets to the wiring tracks in the partial channel region;

wiring inhibited pattern updating means for outputting the wiring results after update of the wiring inhibited pattern corresponding to the results of the trunk allocation by the trunk allocating means; and net list updating means for updating the net list corresponding to the results of the trunk allocation by the trunk allocating means.

In the preferred construction, the partial channel setting means sets the partial channel region by determining the maximum region containing no wiring inhibited pattern along the predetermined generation direction of the partial channel region on the wiring layers for horizontal wiring parallel with the upper and lower boundaries of the channel wiring region.

In another preferred construction, the partial channel setting means divides a wiring inhibited pattern which is not square-shaped on the wiring layer as the target of the partial channel region setting into a plurality of squares using straight lines perpendicular to the upper and lower boundaries of said channel wiring region, sets the highest and lowest points on the perpendicular lines extended from the right or left side of the wiring inhibited patterns on the wiring layer according to certain rules, sets the upper and lower sides of a longitudinal region interposing between the two adjacent perpendicular lines based on the highest and lowest points of the vertical lines, and merges all of the longitudinal regions to synthesize and set a single continuous partial channel between the upper and lower sides of the longitudinal region.

In another preferred construction, the partial channel setting means sets the partial channel region by determining the maximum region containing no wiring inhibited pattern along the predetermined generation direction of the partial channel region on the wiring layers for horizontal wiring parallel with the upper and lower boundaries of the channel wiring region, and the virtual terminal setting means sets virtual terminals at positions corresponding to the connection terminals of a net set selected by the net selecting means on the boundaries of the partial channel region set by the partial channel setting means via a wiring layer which is not a trunk line wiring layer and can pass over the wiring inhibited patterns.

In the above-mentioned construction, the partial channel setting means sets the partial channel region by determining the maximum region containing no wiring inhibited pattern along the predetermined generation direction of the partial channel region on the wiring layers for horizontal wiring parallel with the upper and lower boundaries of the channel wiring region, the wiring region setting means sets the channel wiring region with providing a proper margin for the gaps between the wiring inhibited patterns and the gap between the boundary of the channel wiring region and the wiring inhibited patterns and, based on such gap setting, sets the positions of the wiring inhibited patterns and the channel wiring region boundaries, and the wiring inhibited pattern updating means updates a wiring inhibited pattern with raising the lower boundary of the partial channel by, when there exits a wiring inhibited pattern positioned beneath and adjacent to the lower boundary of the partial channel, moving that wiring inhibited pattern upward as far as possible within the range allowed under the general design rules for semiconductor processors and, when the lower boundary of the partial channel is on the lower boundary of said channel wiring region, by moving the lower boundary of said channel wiring region upward as far as possible within the range allowed under the general design rules for semiconductor processors.

Also, the partial channel setting means sets the partial channel region by determining the maximum region containing no wiring inhibited pattern along the predetermined generation direction of the partial channel region on the wiring layers for horizontal wiring parallel with the upper and lower boundaries of the channel wiring region, the virtual terminal setting means sets virtual terminals at positions corresponding to the connection terminals of a net set selected by the net selecting means on the boundaries of the partial channel region set by the partial channel setting means via a wiring layer which is not a trunk line wiring layer and can pass over the wiring inhibited patterns, the wiring region setting means sets the channel wiring region with providing a proper margin for the gaps between the wiring inhibited patterns and the gap between the boundary of said channel wiring region and the wiring inhibited patterns and, based on such gap setting, sets the positions of the wiring inhibited patterns and the channel wiring region boundaries, and the wiring inhibited pattern updating means updates a wiring inhibited pattern with raising the lower boundary of the partial channel by, when there exits a wiring inhibited pattern positioned beneath and adjacent to the lower boundary of the partial channel, moving that wiring inhibited pattern upward as far as possible within the range allowed under the general design rules for semiconductor processors and, when the lower boundary of the partial channel is on the lower boundary of the channel wiring region, by moving the lower boundary of the channel wiring region upward as far as possible within the range allowed under the general design rules for semiconductor processors.

According to another aspect of the invention, a wiring designing method executed in a wiring designing apparatus for automatic designing of wiring layout on the integrated circuit, comprising the steps of:

a first step to input a net list containing the nets for terminal connections and to set the channel wiring region for wiring;

a second step to set the partial channel region containing no wiring inhibited pattern inside in the channel wiring region set by the wiring region setting means according to certain rules;

a third step to select target nets for wiring designing from the net list input by the wiring region setting means according to certain rules;

a fourth step to set necessary virtual terminals on the boundaries of the partial channel region set by the partial channel setting means for the nets selected by the net selecting means according to certain rules;

a fifth step to allocate the trunks of the selected nets to the wiring tracks in the partial channel region;

a sixth step to output the wiring results after update of the wiring inhibited pattern corresponding to the results of the trunk allocation by the trunk allocating means, and a seventh step to update the net list corresponding to the results of the trunk allocation by the trunk allocating means.

In the above-mentioned construction, the second step to set the partial channel region further comprises a step to divide a wiring inhibited pattern which is not square-shaped on the wiring layer as the target of the partial channel region setting into a plurality of squares using straight lines perpendicular to the upper and lower boundaries of the channel wiring region, a step to set the highest and lowest points on the perpendicular lines extended from the right or left side of the wiring inhibited patterns on the wiring layer according to certain rules, a step to set the upper and lower sides of a longitudinal region interposing between the two adjacent perpendicular lines based on the highest and lowest points of the vertical lines, and a step to merge all of the longitudinal regions to synthesize and set a single continuous partial channel between the upper and lower sides of the longitudinal region.

In another preferred construction, the the second step for partial channel setting sets the partial channel region by determining the maximum region containing no wiring inhibited pattern along the predetermined generation direction of the partial channel region on the wiring layers for horizontal wiring parallel with the upper and lower boundaries of the channel wiring region, and the fourth step for virtual terminal setting sets virtual terminals at positions corresponding to the connection terminals of a net set selected by the net selecting means on the boundaries of the partial channel region set by the partial channel setting means via a wiring layer which is not a trunk line wiring layer and can pass over the wiring inhibited patterns.

In another preferred construction, the first step for wiring region setting sets the channel wiring region with providing a proper margin for the gaps between the wiring inhibited patterns and the gap between the boundary of the channel wiring region and the wiring inhibited patterns and, based on such gap setting, sets the positions of the wiring inhibited patterns and the channel wiring region boundaries, and the sixth step for updating wiring inhibited patterns updates a wiring inhibited pattern with raising the lower boundary of the partial channel by, when there exists a wiring inhibited pattern positioned beneath and adjacent to the lower boundary of the partial channel, moving that wiring inhibited pattern upward as far as possible within the range allowed under the general design rules for semiconductor processors and, when the lower boundary of the partial channel is on the lower boundary of the channel wiring region, by moving the lower boundary of the channel wiring region upward as far as possible within the range allowed under the general design rules for semiconductor processors.

Also, the second step for partial channel setting sets the partial channel region by determining the maximum region containing no wiring inhibited pattern along the predetermined generation direction of the partial channel region on the wiring layers for horizontal wiring parallel with the upper and lower boundaries of the channel wiring region, the fourth step for virtual terminal setting sets virtual terminals at positions corresponding to the connection terminals of a net set selected by the net selecting means on the boundaries of the partial channel region set by the partial channel setting means via a wiring layer which is not a trunk line wiring layer and can pass over the wiring inhibited patterns, the first step for wiring region setting sets the channel wiring region with providing a proper margin for the gaps between the wiring inhibited patterns and the gap between the boundary of the channel wiring region and the wiring inhibited patterns and, based on such gap setting, sets the positions of the wiring inhibited patterns and the channel wiring region boundaries, and the sixth step for updating wiring inhibited patterns updates a wiring inhibited pattern with raising the lower boundary of the partial channel by, when there exists a wiring inhibited pattern positioned beneath and adjacent to the lower boundary of the partial channel, moving that wiring inhibited pattern upward as far as possible within the range allowed under the general design rules for semiconductor processors and, when the lower boundary of the partial channel is on the lower boundary of the channel wiring region, by moving the lower boundary of said channel wiring region upward as far as possible within the range allowed under the general design rules for semiconductor processors.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative of the invention, but are for explanation and understanding only.

In the drawings.

DESCRIPTION OF THE PREFERRED EMBODIMENTS

Preferred embodiments of the present invention will be described in detail with reference to the accompanying drawings.

Figure 1:
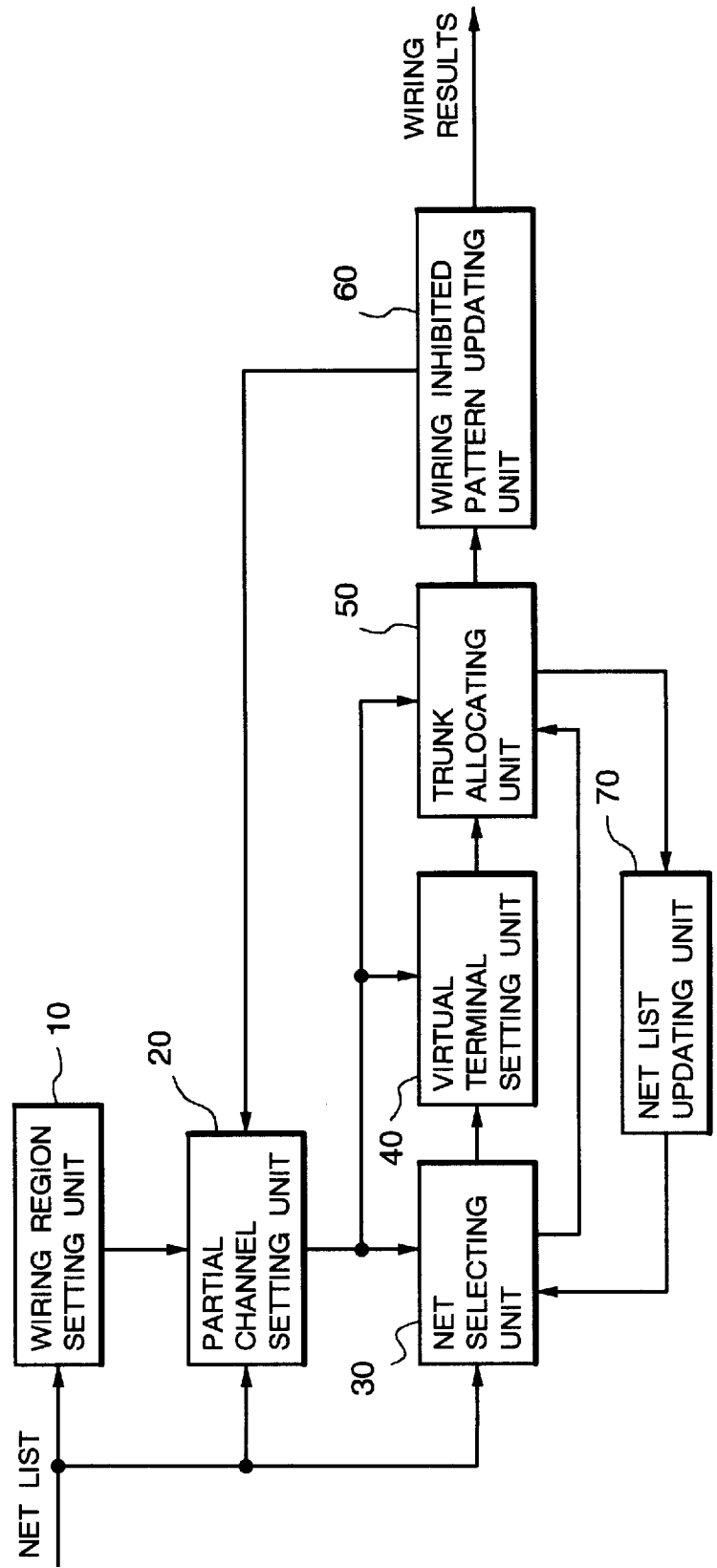
FIG. 1 is a block diagram showing structure of a wiring designing apparatus according to a first embodiment of the present invention.
Figure 2:
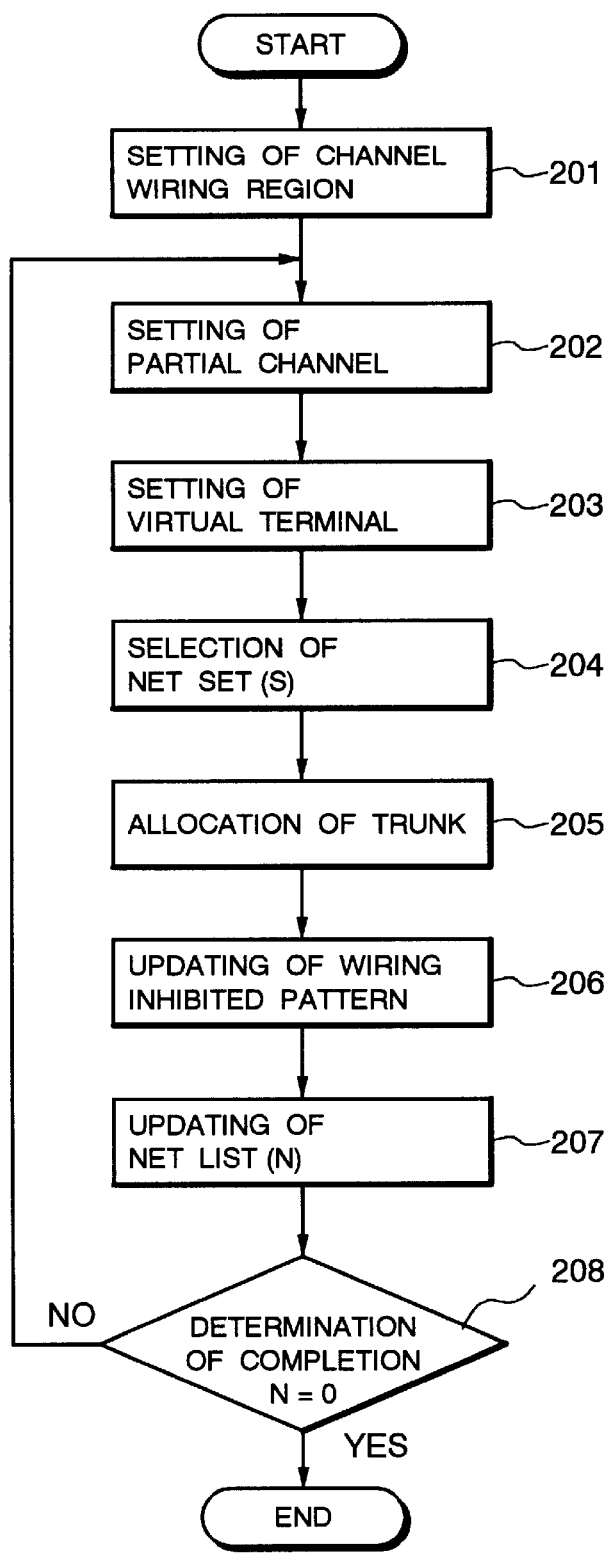
FIG. 2 is a flow chart showing a wiring designing method executed in the present embodiment.

FIG. 1 is a block diagram showing structure of a wiring designing apparatus according to a first embodiment of the present invention.

As illustrated in the figure, the wiring designing apparatus of the present embodiment includes a wiring region setting unit 10 for receiving input of a list of nets which will connect terminals to set a channel wiring region whose wiring is to be conducted, a partial channel setting unit 20 for setting a partial channel region in a set channel wiring region according to predetermined rules, a net selecting unit 30 for selecting a predetermined net from a net list, a virtual terminal setting unit 40 for setting necessary virtual terminals on a selected net, a trunk allocating unit 50 for allocating trunks on a channel wiring region, a wiring inhibited pattern updating unit 60 for updating a wiring inhibited pattern according to a result of trunk allocation and then outputting wiring results, and a net list updating unit 70 for updating a net list according to a result of trunk allocation.

The wiring region setting unit 10, which is implemented by a program-controlled CPU or the like, sets a channel wiring region based on terminal information and wiring inhibition information on a cell for which wiring is to be executed. More specifically, the unit 10 firstly receives input of a net list, a set of nets which will connect terminals. Then, upper and lower boundaries of a channel region are set based on locations of terminals to be connected to each net included in the applied net list and based on wiring inhibited patterns existing within cells located in the vicinity of upper and lower ends of the channel wiring region. Lastly, a partial channel region, with its generation direction set to be either upward or downward, is output to the partial channel setting unit 20.

The partial channel setting unit 20, which is implemented by a program-controlled CPU or the like, sets a partial channel region in a channel wiring region. A partial channel region is an area in a channel wiring region, excluding upper and lower boundaries and a wiring inhibited pattern made up of wiring whose wiring processing is already completed (hereinafter referred to as completed wiring) or a circuit component of completed wiring. A partial channel region is set by obtaining, for each wiring layer for horizontal wiring parallel to the upper and lower boundaries of the channel wiring region, a maximum region not including a wiring inhibited pattern in a generation direction set by the wiring region setting unit 10. The obtained partial channel region is output to the net selecting unit 30, the virtual terminal setting unit 40 and the trunk allocating unit 50.

Operation of the partial channel setting unit 20 will be described in more detail with reference to the flow chart of FIG. 3. In the following example, description will be given of a case where a partial channel region is to be set for one of the wiring layers for horizontal wiring, with a partial channel generation direction set to be downward.

Firstly, in a wiring layer as a partial channel region setting object (hereinafter referred to as a wiring layer (M)), when a wiring inhibited pattern is not rectangular in shape, the wiring inhibited pattern is divided into a plurality of rectangles by using straight lines perpendicular to upper and lower boundaries of the channel wiring region (Step 301).

Next, a vertical line (v) is obtained as a result of extending a line from the right side or a left side of each wiring inhibited pattern of the wiring layer (M), and the lowest-order point among the points of each vertical line (v) which satisfy any of the following first to third conditions is taken as the highest point of each vertical line (v) (Step 302).

The first condition of being a candidate for the highest point is that the point is an intersection between a vertical line (v) and a track to which a trunk is allocated in a partial channel targeted in the previous processing loop, the second condition is that it is an intersection between a vertical line (v) and a lower side of a wiring inhibited pattern adjoining to a lower boundary of a partial channel targeted in the previous processing loop, and the third condition is that it is an intersection between a vertical line (v) and an upper boundary of a channel wiring region. In addition, with respect to all the vertical lines (v), intersections between the vertical lines (v) and wiring tracks are checked downward starting with the highest-order point to take a point at which a vertical line intersects with an upper side of a wiring inhibited pattern or a point at which a vertical line intersects with a lower boundary of a channel wiring region as the lowest point of the vertical line (v). Track numbers of wiring tracks which intersect with the vertical line (v) at its highest point and its lowest point are represented as T(v) and B(v), respectively.

Next, an upper side of a region sandwiched between two adjacent vertical lines (v) and (v') (hereinafter referred to as a longitudinal region) as max {T(v), T(v')} and a lower side as min {B(v), B(v')} (Step 303).

Lastly, all the longitudinal regions are combined to form one continuous region sandwiched between upper and lower sides of the longitudinal regions, wherein the continuous region is set to be a partial channel (Step 304).

The net selecting unit 30, which is implemented by a program-controlled CPU or the like, selects a net set from an applied net list. A net set is a set of candidate nets which will connect terminals in a partial channel set by the partial channel setting unit and which are selected in consideration of restrictions on upper-lower relationships in the allocation of trunks to nets by the trunk allocating unit 50.

The virtual terminal setting unit 40, which is implemented by a program-controlled CPU or the like, sets a virtual terminal on a boundary of a partial channel as necessary. A virtual terminal is set at a position corresponding to a connection terminal of a net set selected by the net selecting unit 30, via a wiring layer which is allowed to pass over wiring inhibited patterns other than the wiring layer (M). Location information of a set virtual terminal is output to the trunk allocating unit 50.

Figure 4:
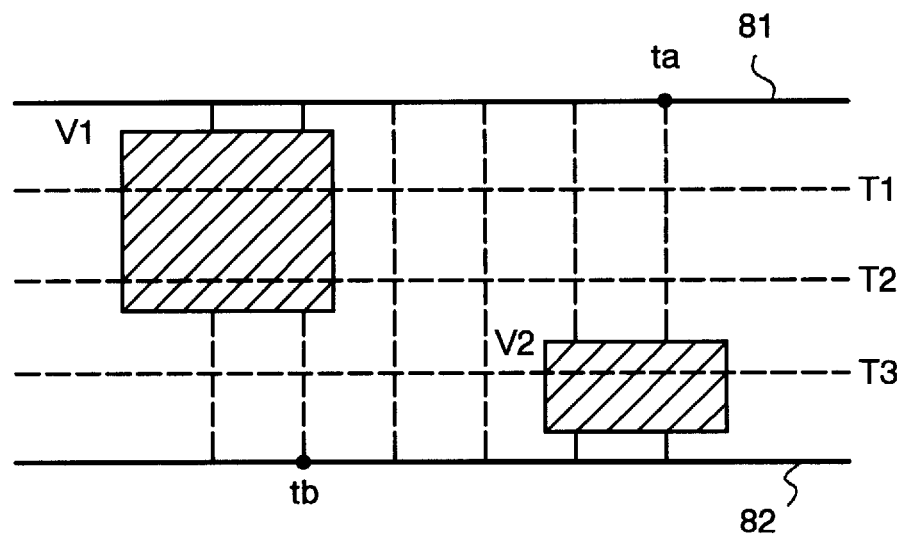
FIG. 4 is a schematic diagram of a channel wiring region showing a virtual terminal setting procedure according to the present embodiment.
Figure 5:
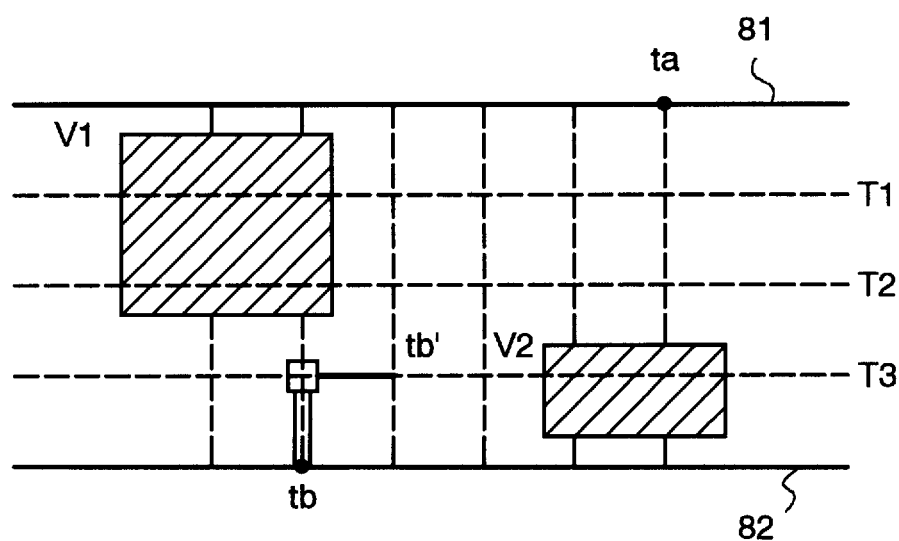
FIG. 5 is a schematic diagram of a channel wiring region showing a virtual terminal setting procedure according to the present embodiment as well as a diagram showing the state of a virtual terminal being set.

The virtual terminal setting processing by the virtual terminal setting unit 40 will be described in detail with reference to FIGS. 4 and 5. FIG. 4 is a schematic diagram showing an example of the structure of a channel wiring region, while FIG. 5 is a diagram showing the state of a virtual terminal being set in the channel wiring region shown in FIG. 4.

As illustrated in the figures, three wiring tracks T1, T2 and T3 are provided and two wiring inhibited patterns (V1) and (V2) exist in a channel wiring region sandwiched between an upper boundary 81 and a lower boundary 82. The wiring inhibited pattern (V1) is located on the wiring tracks T1 and T2, while the wiring inhibited pattern (V2) is located on the wiring track T3. Both of the patterns are assumed to be obstructions to a wiring layer for longitudinal wiring. A case will be described wherein a terminal ta located on the upper boundary 81, right above the wiring inhibited pattern (V2), and a terminal tb located on the lower boundary 82, right below the wiring inhibited pattern (V1), are to be connected in the thus structured channel wiring region.

If line segments extend from the terminals ta and tb toward the boundaries 82 and 81 on the opposite side to reach them or the wiring inhibited patterns (V2) and (V1), respectively, checking wiring tracks which intersect with the line segments will result in a finding that no wiring track exists that intersects with the line segment extending from the terminal ta and the line segment extending from the terminal tb. That is, it is impossible to connect the terminal ta and the terminal tb by a single trunk. Therefore, partial leader wiring, which bypasses the wiring inhibited pattern (V1), is made from the terminal tb and the end point of the wiring is taken as a virtual terminal tb', as illustrated in FIG. 5.

On the other hand, when there exists a wiring track which intersects with both the line segments extending from the respective terminals, depending on the shape and location of a wiring inhibited pattern, leader wiring is made from the terminal to a boundary of a partial channel by using a wiring layer for longitudinal wiring and an intersection between the said wiring and the boundary of the partial channel is taken as a virtual terminal.

The trunk allocating unit 50, which is implemented by a program-controlled CPU or the like, allocates a trunk of a net included in a net set selected by the net selecting unit 40 to wiring tracks in a partial channel based on the position of a virtual terminal set by the virtual terminal setting unit 40. The result of the allocation is output to the wiring inhibited pattern updating unit 60 and the net list updating unit 70.

The wiring inhibited pattern updating unit 60, which is implemented by a program-controlled CPU or the like, registers a trunk allocated to a net by the trunk allocating unit 50 as a new wiring inhibited pattern, thereby updating the wiring inhibited pattern.

The new list updating unit 70, which is implemented by a program-controlled CPU or the like, updates a net list based on information regarding a net to which a trunk is allocated by the trunk allocating unit 50. More specifically, the unit 70 deletes a net whose trunk has been allocated to a wiring track from a net list to update the same.

Operation of the present embodiment will be described with reference to the flow chart of FIG. 2 and FIGS. 6 to 10. FIGS. 6 to 10 are schematic diagrams each showing one example of structure of a channel wiring region as well as showing the progress of the wiring designing processing according to the present embodiment.

Figure 6:
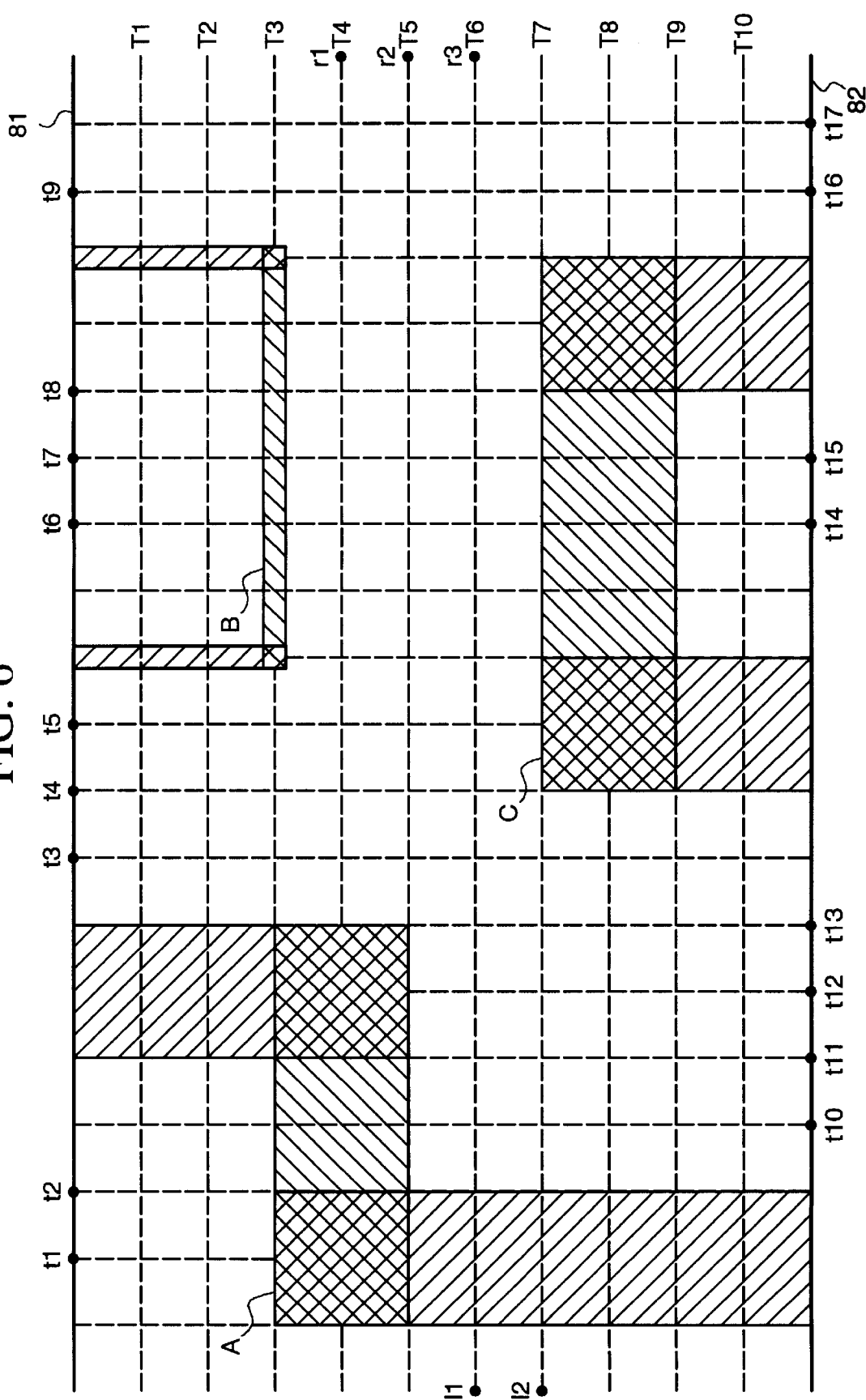
FIG. 6 is a schematic diagram of a channel wiring region showing operation of the present embodiment.

A channel wiring region whose wiring is to be designed, as illustrated in FIG. 6, includes a wiring layer (M1) for horizontal wiring and a wiring layer (M2) for vertical wiring. In the wiring layer (M1), ten tracks T1 to T10 for wiring are arranged downward in this order in an area sandwiched between the upper boundary 81 and the lower boundary 82 of the channel wiring region. Nets which connect terminals l1 l2, r1, r2, r3 and t1 to t17 in this channel wiring region will be expressed as:

n1={t1, t6}
n2={t2, t5}
n3={t3, t17}
n4={t4, r1}
n5={t7, t9}
n8={t8, t10}
n7={t11, l1}
n8={t12, t14, t15, r2}
n9={t13, l2}
n10={t16, r3}

A list (N) of nets as the objects of wiring, which includes these nets n1 to n10 is expressed as follows.
(N)={n1, n2, n3, n4, n5, n8, n7, n8, n9, n10}

Terminals l1 and l2 are for connection of the left end of the channel wiring region with the outside of the region, while terminals r1, r2 and r3 are for connection of the right end with the outside of the region. In the figure, regions (A), (B) and (C) are wiring inhibited patterns formed by completed wiring. As illustrated in the figure, the wiring inhibited patterns are obstructions to one or both of the wiring layers (M1) and (M2), depending on a wiring layer used for the completed wiring.

For preparing a wiring design for the thus structured channel wiring region according to the present embodiment, firstly, the wiring setting unit 10 defines the upper and lower boundaries 81 and 82 to set a channel wiring region (Step 201).

Then, the partial channel setting unit 20 sets a partial channel region by the following procedure (Step 202). It is assumed that the partial channel is generated in a direction downward from the upper boundary 81.

First, noting a wiring inhibited pattern for the wiring layer (M2) for horizontal wiring, vertical lines are drawn from the respective terminals t1 to t17 to the boundaries 82 and 81, to the opposite side of the respective boundaries 81 and 82 on which the terminals t1 to t17 are arranged. Then, a line segment corresponding to each of the terminals t1 to t17 is obtained, which line segment is a vertical line extending between the terminal and an intersection with the wiring inhibited pattern for the wiring layer (M2).

Then, a set of reachable tracks RT(t) is obtained for each of the terminals t1 to t17. A reachable wiring track is a wiring track which intersects with a line segment obtained corresponding to each of the terminals t1 to t17 but not with a wiring inhibited pattern for the wiring layer (M1) for horizontal wiring. In the example shown in FIG. 6, a reachable track for each terminal will be as follows.

RT (t1)={T1, T2}
RT (t2)={T1, T2}
RT (t3)={T1, T2, T3, T4, T5, T6, T7, T8 T9, T10}
RT (t4)={T1, T2, T3, T4, T5, T6}
RT (t5)={T1, T2, T3, T4, T5, T6}
RT (t6)={T1, T2, T4, T5, T6, T10}
RT (t7)={T1, T2, T4, T5, T6, T10}
RT (t8)={T1, T2, T4, T5, T6}
RT (t9)={T1, T2, T3, T4, T5, T6, T7, T8, T9, T10}
RT (t10)={T1, T2, T6, T7, T8, T9, T10}
RT (t11)={T6, T7, T8, T9, T10)
RT (t12)={T6, T7, T8, T9, T10}
RT (t13)={T6, T7, T8, T9, T10}
RT (t14)={T1, T2, T4, T5, T6, T10}
RT (t15)={T1, T2, T4, T5, T6, T10}
RT (t16)={T1, T2, T3, T4, T5, T6, T7, T8, T9, T10}
RT (t17)={T1, T2, T3, T4, T5, T6, T7, T8, T9, T10}

For the terminals l1, l2, r1, r2 and r3, RT is assumed to be RT={T1, T2, t3, T4, T5, T6, T7, T8, T9, T10}.

Figure 3:
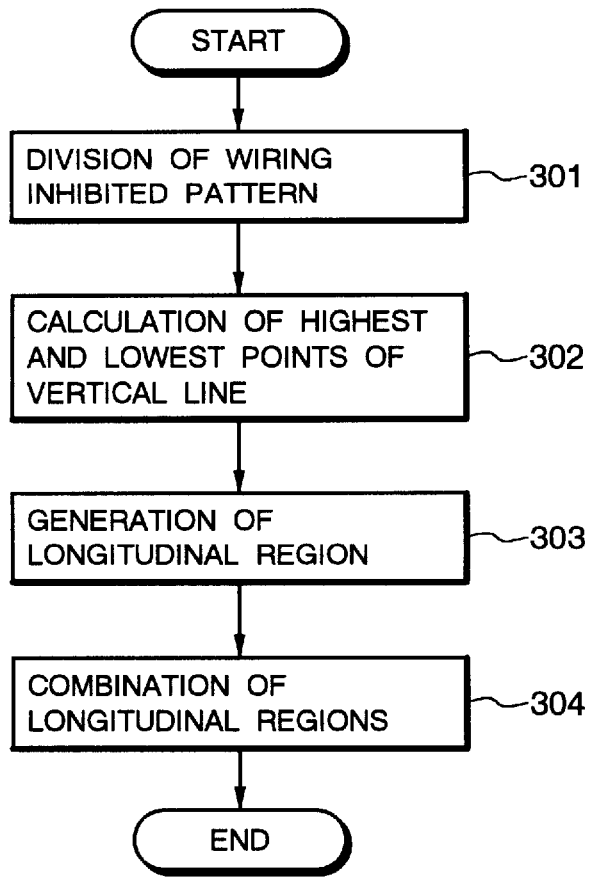
FIG. 3 is a flow chart showing a partial channel region generating procedure according to the present embodiment.
Figure 7:
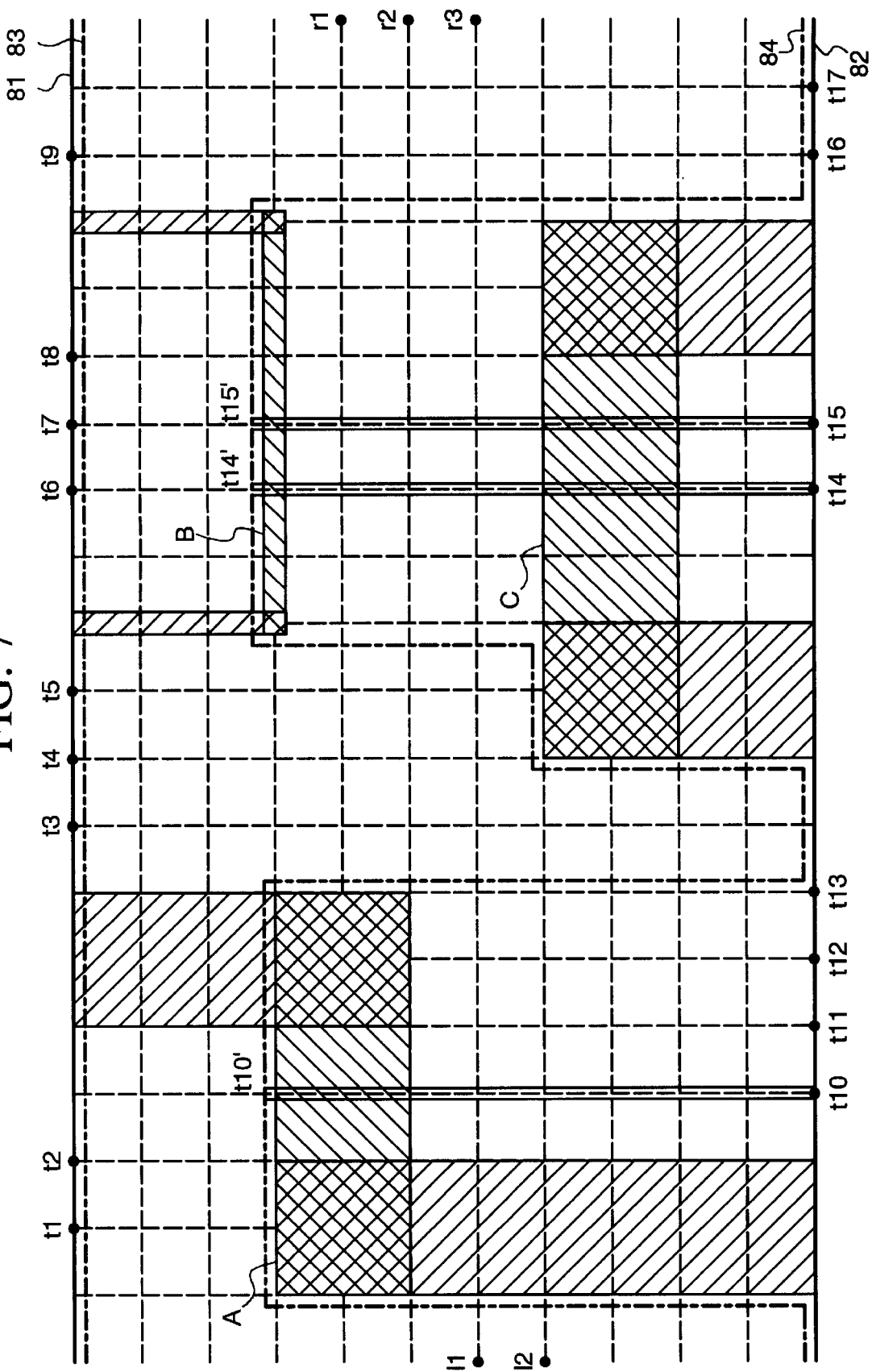
FIG. 7 is a schematic diagram of a channel wiring region showing operation of the present embodiment as well as a diagram showing the state of a partial channel region and a virtual terminal being set.

Based on the foregoing information on reachable tracks and according to the procedure shown in FIG. 3, a partial channel region for the wiring layer (M1) is set. In the present embodiment, an area sandwiched between the boundaries 83 and 84 shown in FIG. 7 is a partial channel region.

Then, the virtual terminal setting unit 40 sets a virtual terminal corresponding to a terminal not adjoining to the set partial channel region (Step 203). Firstly, a set of tracks reachable by terminals to be connected is obtained for each of the nets n1 to n10 to find existence/non-existence of common elements. Leader wiring then is made that bypasses a wiring inhibited pattern and an end point of the leader wiring is taken as a virtual terminal. In the present embodiment, virtual terminals t10', t14' and t15' corresponding to the terminals t10, t14 and t15 are set on the boundary of the partial channel, as illustrated in FIG. 7.

Next, the net selecting unit 30 takes all of the nets that have a terminal or a virtual terminal on a boundary of a partial channel set by the partial channel setting unit 20 as candidate nets whose trunks are to be allocated in the partial channel and generates a set (S) of the nets included as elements (Step 204). In this embodiment, the set (S) of candidate nets for the partial channel is: (S)={n1, n2, n3, n4, n5, n6, n10}.

Next, according to the procedure set forth below, the trunk allocating unit 50 allocates the nets included in the set (S) generated by the net selecting unit 30 to the partial net set by the virtual terminal setting unit 40 (Step 205).

Figure 11:
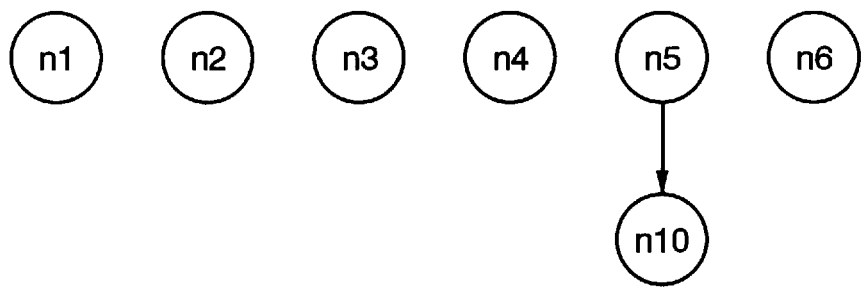
FIG. 11 is a locational restriction graph generated by the operation of the present embodiment for the channel wiring region of FIG. 6.

Firstly, with respect to each net included in the set (S), restrictions on upper-lower relationships among trunks are set according to the location of virtual terminals. The locational restriction graph representing upper-lower restrictions in the present embodiment is shown in FIG. 11. As illustrated in the figure, there exists no upper-lower restrictions among the nets n1, n2, n3, n4, n5 and n6, and the net n10 ranks below the net n5. Moreover, a list (L) is obtained in which nets included in the set (S) are arranged in ascending order of allocation allowability. Here, allocation allowability stands for the minimum value "min {|RT (t)|:(t belongs to n)}" of the number of reachable tracks "|RT(t)|" for a terminal t belonging to each net included in the set (S). In this embodiment, the list (L) is represented as: (L)=(n1=n2, n6, n4=n5, n3=n10).

Next, based on the set upper-lower restrictions and list (L), a trunk of each net in the set (S) is allocated to a wiring track in a partial channel. In other words, according to the upper-lower restrictions shown in the locational restriction graph of FIG. 11, allocated to the wiring track T1 in the uppermost part of the partial channel are trunks of the net n1 and the net n5, and allocated to the subsequent wiring track T2 in accordance with the order of the list (L) is a trunk of the net n2. Furthermore, a trunk of the net n10 is allocated to the same wiring track T2 as the trunk of the net n2.

Figure 8:
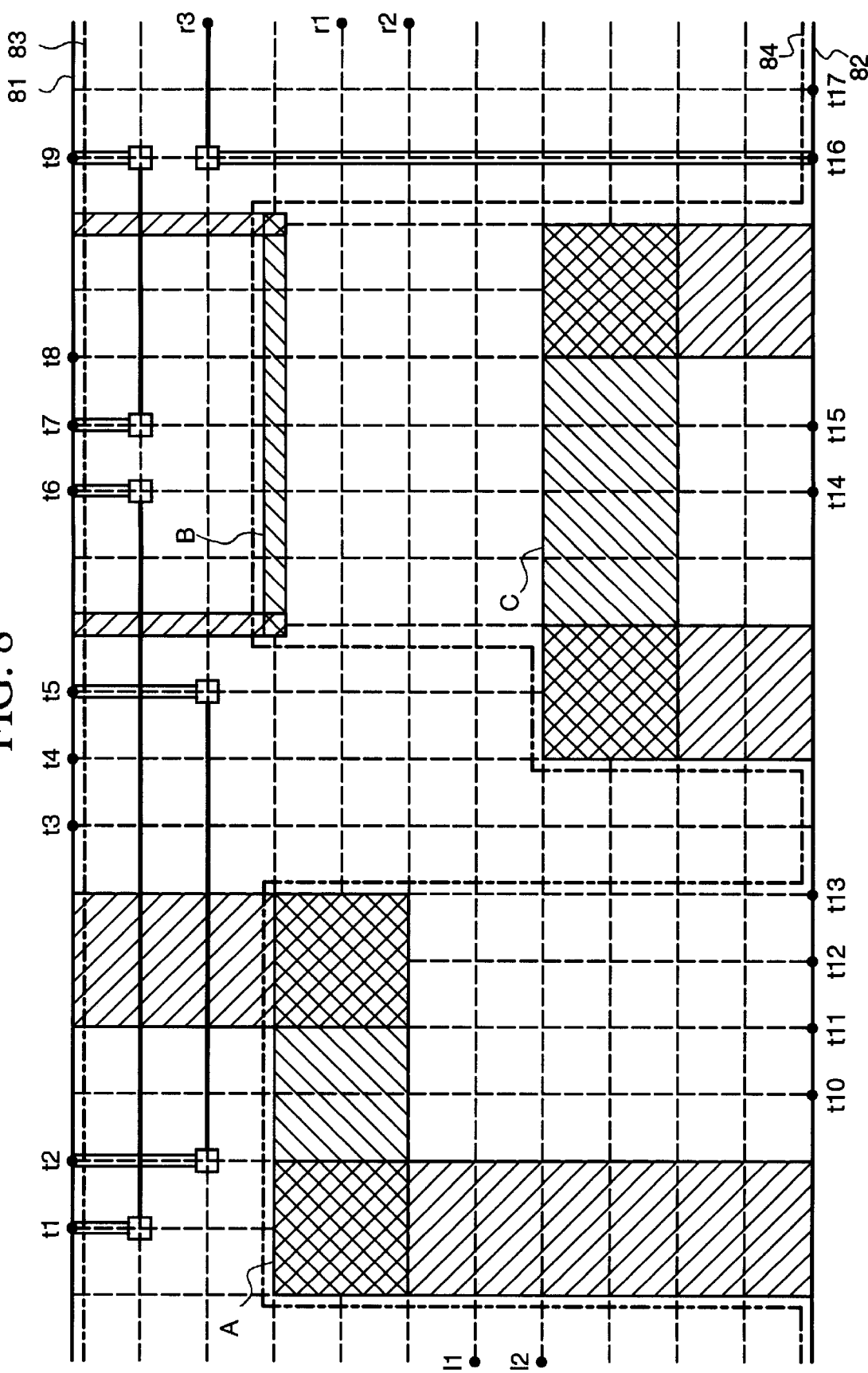
FIG. 8 is a schematic diagram of a channel wiring region showing operation of the present embodiment as well as a diagram showing the state of the first wiring processing being completed.
Figure 9:
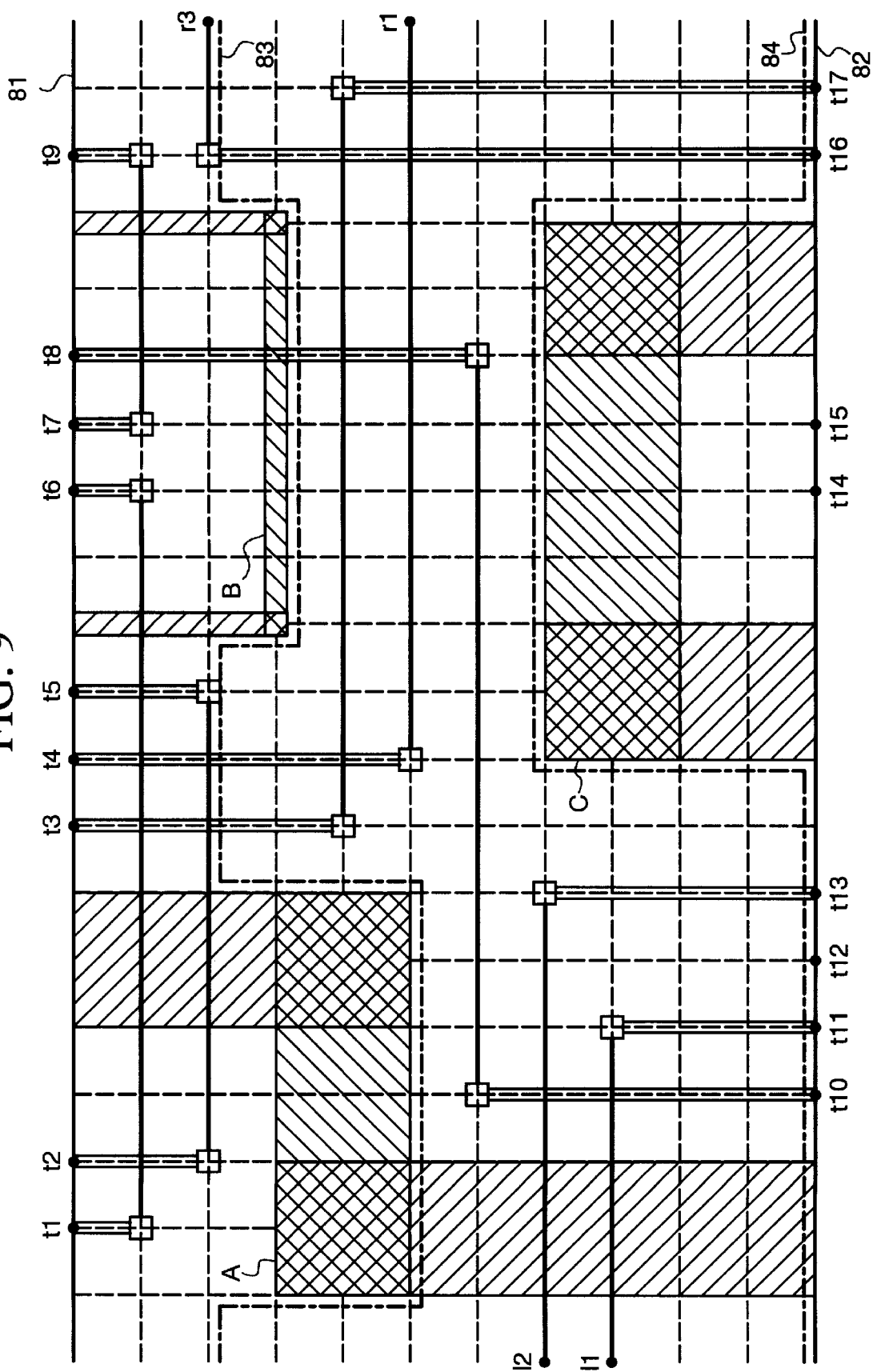
FIG. 9 is a schematic diagram of a channel wiring region showing operation of the present embodiment as well as a diagram showing the state of the second wiring processing being completed.

FIG. 8 shows the state of trunks being allocated to a partial channel in a manner as described above. As can be seen from the figure, allocation has been completed for a trunk of the net n1 which connects the terminals t1 and t6, that of the net n2 which connects the terminals t2 and t5, that of the net n5 which connects the terminals t7 and t9, and that of the net n10 which connects the terminals t16 and r3.

Next, the wiring inhibited pattern updating unit 60 registers a wiring result as a wiring inhibited pattern to update the wiring inhibited pattern (Step 206). At this time, for a net whose trunk has been allocated, branch wiring from the trunk to a terminal is made through the wiring layer (M2). In addition, wiring for setting virtual terminals which are not used for the wiring by the trunk allocating unit 50 is deleted, out of the virtual terminals set by the virtual terminal setting unit 40.

The net list updating unit 70 then deletes a net whose wiring is completed from the net list (N) to update the list (N) (Step 207). In this embodiment, the nets n1, n2, n5 and n10 are deleted from the net list (N), resulting in the updated net list (N) being (n3, n4, n6, n7, n8, n9). Moreover, with respect to each terminal t of a net belonging to the updated net list (N), a set of reachable tracks RT(t) is recalculated in consideration of updating results of a wiring inhibited pattern obtained by the wiring inhibited pattern updating unit, that is, in consideration of a wiring track used for the wiring.

Lastly, the updated net list (N) is checked to determine whether the net list is an empty set or not (Step 208). When the net list (N) is an empty set, that is, when wiring is completed by all the nets, wiring processing ends. On the other hand, when the net list (N) is not an empty set, that is, when there exists a net whose wiring is yet to be made, processing will be repeated, starting with setting of a partial channel (Step 202). In this embodiment, since the net list (N) is {n3, n4, n6, n7, n8, n9} as a result of the processing executed so far, and there exists a net whose wiring is yet to be made as described above, processing will be repeated, starting with the setting of a partial channel (Step 202).

In the second processing, wiring processing is carried out in the same manner as described above to obtain a wiring result as shown in FIG. 9. As illustrated in the figure, allocation is completed of the trunk of the net n3 which connects the terminals t3 and t17, that of the net n4 which connects the terminals t4 and r1, that of the net n6 which connects the terminals t8 and t10, that of the net n7 which connects the terminals 11 and t11, and that of the net n9 which connects the terminals 12 and t13.

Figure 10:
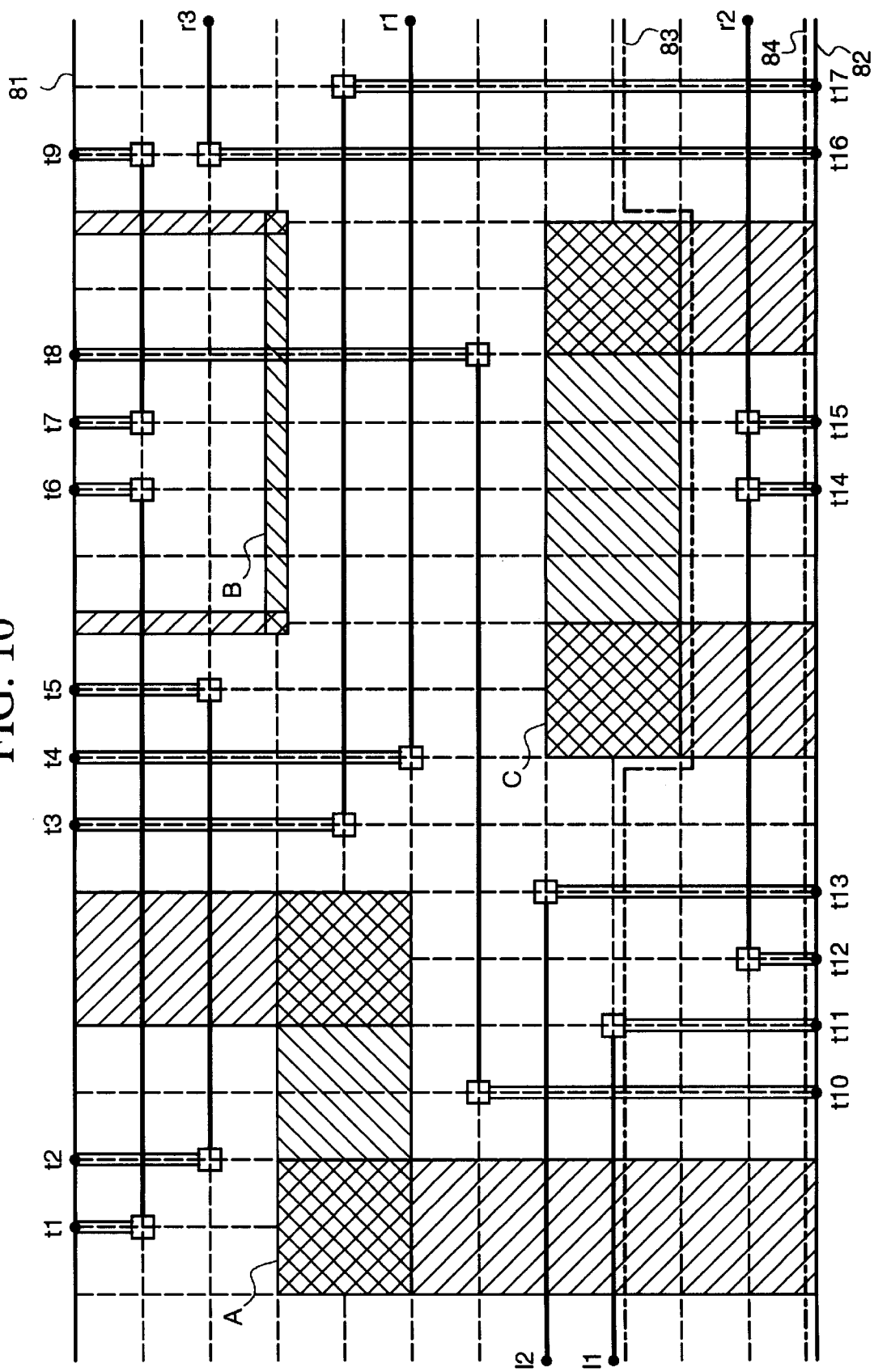
FIG. 10 is a schematic diagram of a channel wiring region showing operation of the present embodiment as well as a diagram showing the state of the third wiring processing being completed.

In the third processing, wiring processing is carried out in the same manner as descried above to obtain such a wiring result as shown in FIG. 10. As illustrated in the figure, allocation is completed of the trunk of the net n8 which connects the terminals t12, t14, t15 and r2. The foregoing processing results in the net list (N) being an empty set to thereby end wiring processing, with all the wiring being completed.

Figure 24:
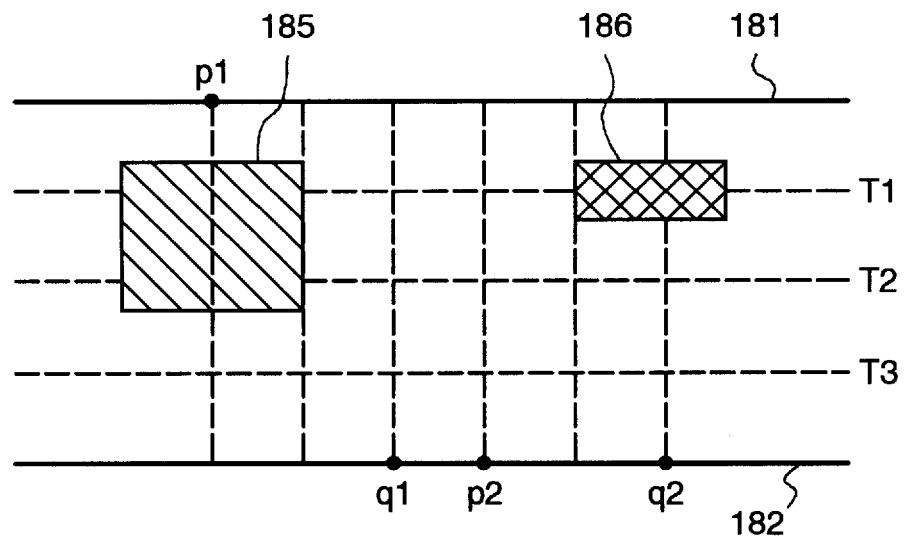
FIG. 24 is a schematic diagram of a channel wiring region showing another example of operation of a conventional wiring designing method.
Figure 25:
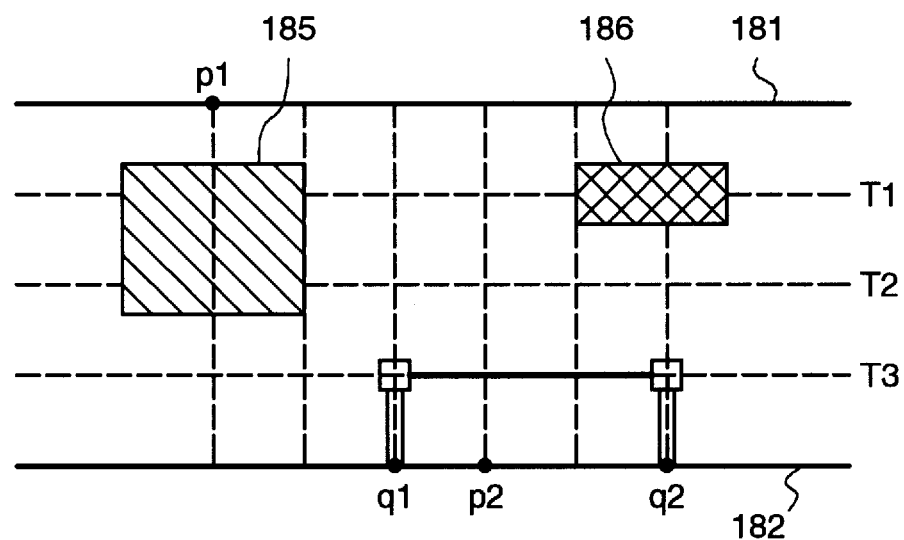
FIG. 25 is a schematic diagram of a channel wiring region showing another example of operation of a conventional wiring designing method as well as a diagram showing the state of wiring being completed.

Now, with reference to FIG. 24, which is presented as an example of a channel wiring region whose wiring would be impossible to complete by a conventional channel wiring processing technique, description will be given of a case where the present embodiment is applied to this channel wiring region.

As described above, three wiring tracks T1 to T3 are arranged between the upper and lower boundaries 181 and 182 of the illustrated channel wiring region. Further arranged are a wiring inhibited pattern 185 which is an obstruction only to the wiring layer (M1) for the wiring of trunks and a wiring inhibited pattern 186 which is an obstruction to both the wiring layer (M1) for the wiring of trunks and the wiring layer (M2) for the wiring of connection branches. The net list (N) is represented as (N)={P,Q}, the net (P) as (P)={p1, p2} and the net (Q) as (Q)={q1, q2}. The terminal p1 is located on the upper boundary 181, right above the wiring inhibited pattern 185, while the terminal q2 is located right below the wiring inhibited pattern 186.

Firstly, the wiring region setting unit 10 sets the upper and lower boundaries 181 and 182 of the channel wiring region. Reachable tracks for the respective terminals are: RT (p1) ={T3}, RT (p2)={T1, T2, T3}, RT (q1)={T1, T2, T3}, RT (q2)={T2, T3}. A partial channel generation direction is set to be downward.

Figure 12:
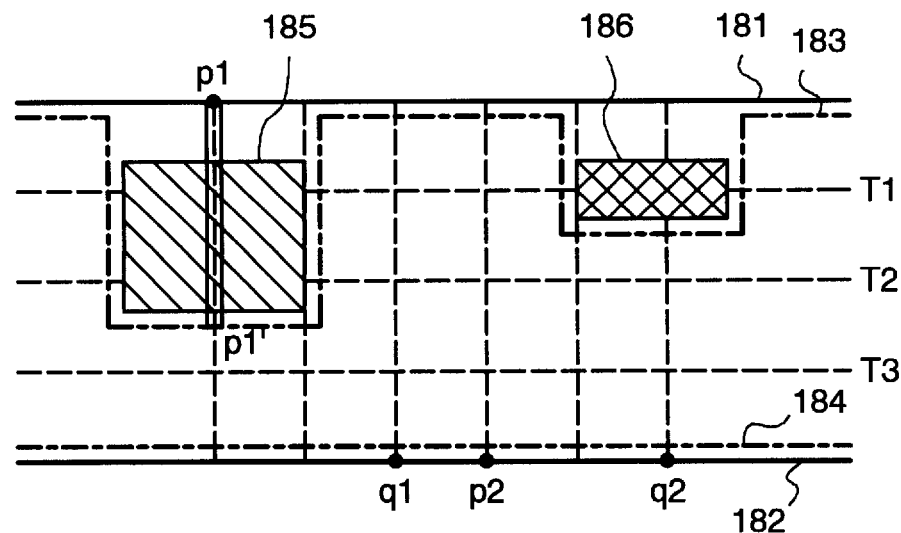
FIG. 12 is a schematic diagram of a channel wiring region showing another example of operation of the present embodiment.

Next, the partial channel setting unit 20 sets a partial channel. As shown in FIG. 12, the upper boundary 183 and the lower boundary 184 of the partial channel are set.

Then, the virtual terminal setting unit 40 sets a virtual terminal p1' corresponding to the terminal p1, on the upper boundary 183 of the partial channel, as shown in FIG. 12. The net selecting unit 30 then sets a set (S) of net candidates whose trunks are to be allocated to the partial channel as (S)={P,Q}.

Next, allocation of trunks are conducted by the trunk allocating unit 50. Here, in this example, there exists no upper-lower restrictions in the partial channel. In addition, a list of allocation allowabilities (L) is determined {P,Q}. With no upper-lower restrictions, trunks are allocated based only on the list (L).

Firstly, a determination is made whether a trunk of the net (P) listed at the top of the list (L) is allocable to the wiring track T1 located at the highest part of the partial channel or not. In this case, because the wiring track T1 includes no section of the trunk of the net (P) due to the boundary 183, allocation to the wiring track T1 is not possible. Similarly, it is not possible to allocate wiring of the net (Q), which is the second element of the list (L), to the wiring track T1.

Next, determination is similarly made with respect to the wiring track T2 as to whether wiring is possible or not. Wiring of the net (P) is impossible as in the case of the wiring track T1. On the other hand, allocation of the trunk of the net (Q) to the wiring track T2 is possible because a section of the trunk is completely included in the wiring track T2. The trunk of the net (Q) is therefore allocated to the wiring track T2.

Next, a determination is made whether allocation of a trunk of the net (P) to the wiring track T3 is possible or not. In this case, allocation is possible because a section of the trunk is completely included in the wiring track T3. The trunk of the net (P) is therefore allocated to the track T3.

Figure 13:
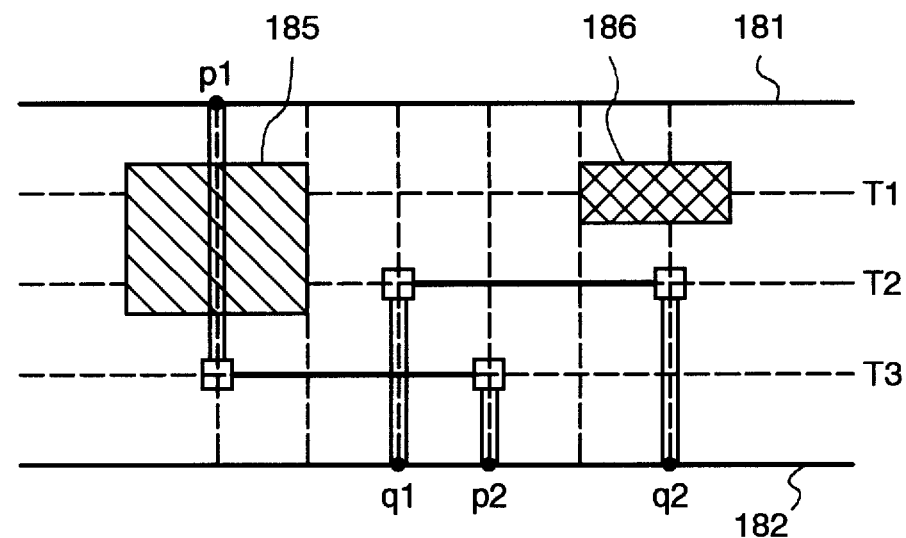
FIG. 13 is a schematic diagram of a channel wiring region showing another example of operation of the present embodiment as well as a diagram showing the state of wiring being completed.

Then, by using the wiring layer (M2), the wiring inhibited pattern updating unit 60 conducts branch wiring for a net whose trunk is already allocated, from the trunk to a terminal, and registers wiring results as a wiring inhibited pattern. The wiring results obtained through the foregoing processing are shown in FIG. 13.

Lastly, the net list updating unit 70 deletes the nets (P) and (Q) whose wiring is completed from the net list (N). As a result, the net list (N) becomes an empty set, whereby wiring processing is completed.

As described in the foregoing, the present embodiment enables wiring processing for a channel wiring region whose wiring would be impossible to accomplish by a conventional method, without leaving any wiring not completed.

Figure 14:
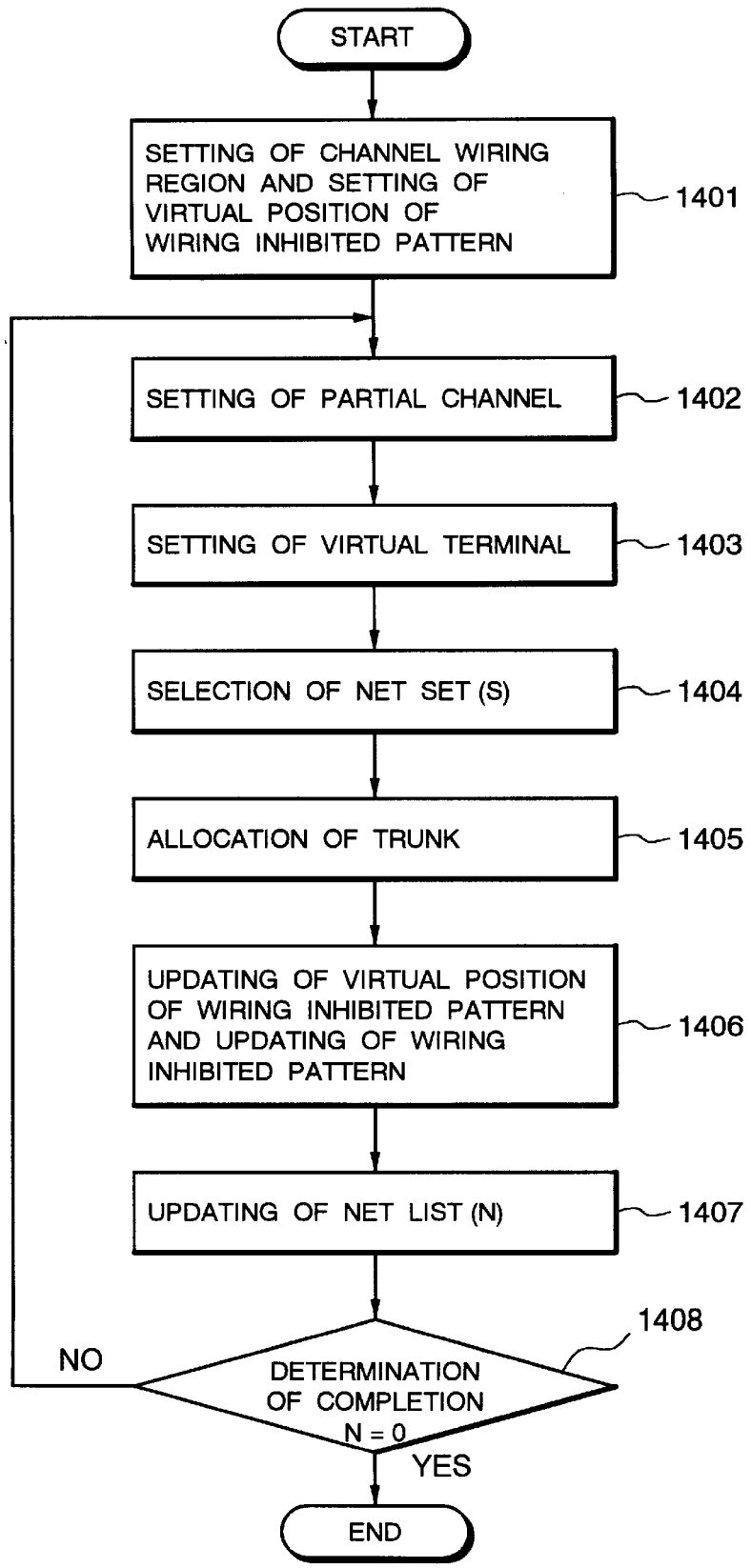
FIG. 14 is a flow chart showing a wiring designing method executed by a wiring designing apparatus according to a second embodiment of the present invention.

FIG. 14 shows a flowchart to illustrate the operation of a wiring processing apparatus according to a second embodiment of the present invention.

The configuration of a wiring processing apparatus according to this embodiment is the same as that in the first embodiment shown in FIG. 1. However, this embodiment is different from the first embodiment above. It allows the channel wiring region boundary to move in the direction perpendicular to the boundary line and is applied when a wiring inhibited pattern is movable while keeping its relative positional relation with other wiring inhibited patterns. In other words, while the first embodiment is utilized for wiring processing after fixing the layout on an integrated circuit, this embodiment is utilized in an earlier phase where the layout on the integrated circuit has not been strictly fixed yet and can be changed by moving of a wiring inhibited pattern to the extent it maintains the relative positional relationships.

In this embodiment, a wiring region setting unit 10 sets a channel wiring region according to the terminal information and the wiring inhibition information about the cell for wiring. Specifically, the net list containing the nets for terminal connections is input first. Then, based on the positions of the terminals to be connected to the nets in the input net list and the wiring inhibited patterns existing inside the cell laid out near the upper and lower ends of the channel wiring region, the upper and lower boundaries of the channel wiring region are determined. Finally, the generation direction of the partial channel region is set to either "upward" or "downward", which is output to the partial channel setting unit 20.

The wiring region setting unit 10 in this embodiment sets the position of a movable wiring inhibited pattern as follows. First, the wiring inhibited pattern at the uppermost position among all wiring inhibited patterns is arranged so that its vertical position is separated from the upper boundary of the channel wiring region by alpha (for a distance corresponding to alpha wiring tracks). The value alpha is set here with a certain margin for flexible wiring design in the applicable channel wiring region. If, with the positions given to the wiring inhibited patterns as default values (hereinafter referred to as the default positions), the uppermost wiring inhibited pattern is separated from the upper boundary of the channel wiring region for more than the set value alpha, then that wiring inhibited pattern is not allowed to move. For other wiring inhibited patterns, with keeping the relative upper-lower relations among the wiring inhibited patterns determined by the default positions, the vertical positions are set starting from the uppermost wiring inhibited pattern and proceeding downward so that the adjacent wiring inhibited patterns are separated for more than alpha.

A wiring inhibited pattern updating unit 60 registers the trunk allocated to the net by a trunk allocating unit 50 as a new wiring inhibited pattern to update the wiring inhibited patterns. Here, the wiring inhibited pattern positioned beneath the lower boundary of the partial channel and adjacent to that boundary is moved upward as far as possible within the range allowed under the general design rules for semiconductor processors so that the lower boundary of the partial channel is raised. If the lower boundary of the partial channel is on the lower boundary of the channel wiring region, the lower boundary of the channel wiring region is moved upward as far as possible within the range allowed under the general design rules for semiconductor processors so that the lower boundary of the partial channel is raised.

Other units including a partial channel setting unit 20, a net selecting unit 30, a virtual terminal setting unit 40, a trunk allocating unit 50, and a net list updating unit 70 have the same functions as the corresponding units in the first embodiment.

Referring now to the flowchart of FIG. 14 and FIGS. 21 to 25, the operation in this embodiment is described below. FIGS. 21 to 25 show model diagrams illustrating a configuration example of a channel wiring region and the progress of the wiring design according to this embodiment.

Note that the channel wiring region as the target of the wiring design is the region in FIG. 6 used for the operation description of the first embodiment. Specifically, the wiring inhibited patterns (A), (B) and (C) exist as shown in the figure with a wiring layer for horizontal wiring (M1) and a wiring layer for vertical wiring (M2). The wiring inhibited pattern indicates the already laid out wires with a large width such as power supply lines and its position can be moved vertically. When the trunk of already laid out wires is moved, its branches must be extended or reduced correspondingly. Further, the position of the wiring inhibited pattern shown in FIG. 6 is treated as the default position and the separation from the adjacent wiring inhibited pattern is set to be "4".

Figure 15:
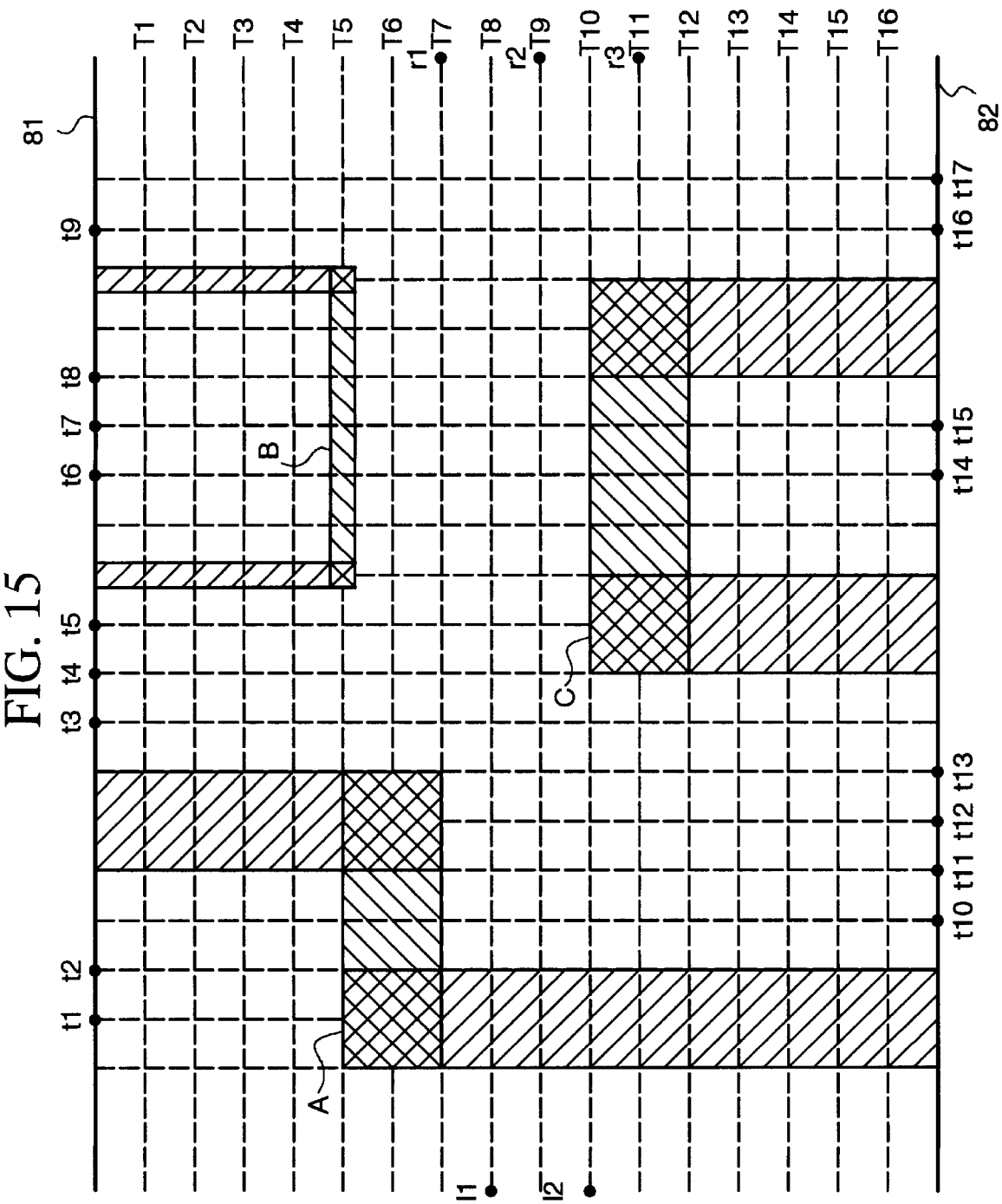
FIG. 15 is a schematic diagram of a channel wiring region showing operation of the second embodiment.

First, the wiring setting unit 10 defines the upper and lower boundaries 81 and 82 to set the channel wiring region (Step 1401). Partial channels are generated in the downward direction from the upper boundary 81. While keeping the upper-lower relationship constant among them, the wiring inhibition patterns are moved so that they are separated for more than the set value "4". FIG. 15 shows the channel wiring region after moving the wiring inhibited patterns. As shown in the figure, the wiring layer (M1) is provided with sixteen wiring tracks T1 to T16.

Then, the partial channel setting unit 20 sets a partial channel region according to the same procedure as in the operation example according to the first embodiment (Step 1402). Thus, the reachable tracks of the terminals are determined as follows.

RT(t1)={T1,T2,T3,T4}
RT(t2)={T1,T2,T3,T4}
RT(t3)={T1,T2,T3,T4,T5,T6,T7,T8,T9,T10,T11,T12,T13,T14,T1 5,T16}

RT(t4)={T1,T2,T3,T4,T5,T6,T7,T8,T9}
RT(t5)={T1,T2,T3,T4,T5,T6,T7,T8,T9}
RT(t6)={T1,T2,T3,T4,T5,T6,T7,T8,T9,T13,T14,T15,T16},
RT(t7)={T1,T2,T8,T4,T5,T6,T7,T8,T9,T13,T14,T15,T16}
RT(t8)={T1,T2,T3,T4,T6,T7,T8,T9}
RT(t9)={T1,T2,T3,T4,T5,T6,T7,T8,T9,T10,T11,T12,T13,T14,T1 5,T16}
RT(t10)={T1,T2,T3,T4,T8,T9,T10,T11,T12,T13,T14,T15,T16}
RT(t11)={T8,T9,T10,T11,T12,T13,T14,T15,T16}
RT(t12)={T8,T9,T10,T11,T12,T13,T14,T15,T16}
RT(t18)={T8,T9,T10,T11,T12,T13,T14,T15,T16}
RT(t14)={T1,T2,T3,T4,T6,T7,T8,T9,T13,T14,T15,T16}
RT(t15)={T1,T2,T3,T4,T6,T7,T8,T9,T13,T14,T15,T16}
RT(t16)={T1,T2,T3,T4,T5,T6,T7,T8,T9,T10,T11,T12,T13,T14, T15,T16}
RT(t17)={T1,T2,T3,T4,T5,T6,T7,T8,T9,T10,T11,T12,T13,T14, T15,T16}
For the terminals l1,l2,r1,r2,r3: RT={T1,T2,T3,T4,T5,T6,T7,T8,T9,T10,T11,T12,T13,T14,T15,T16}

Figure 16:
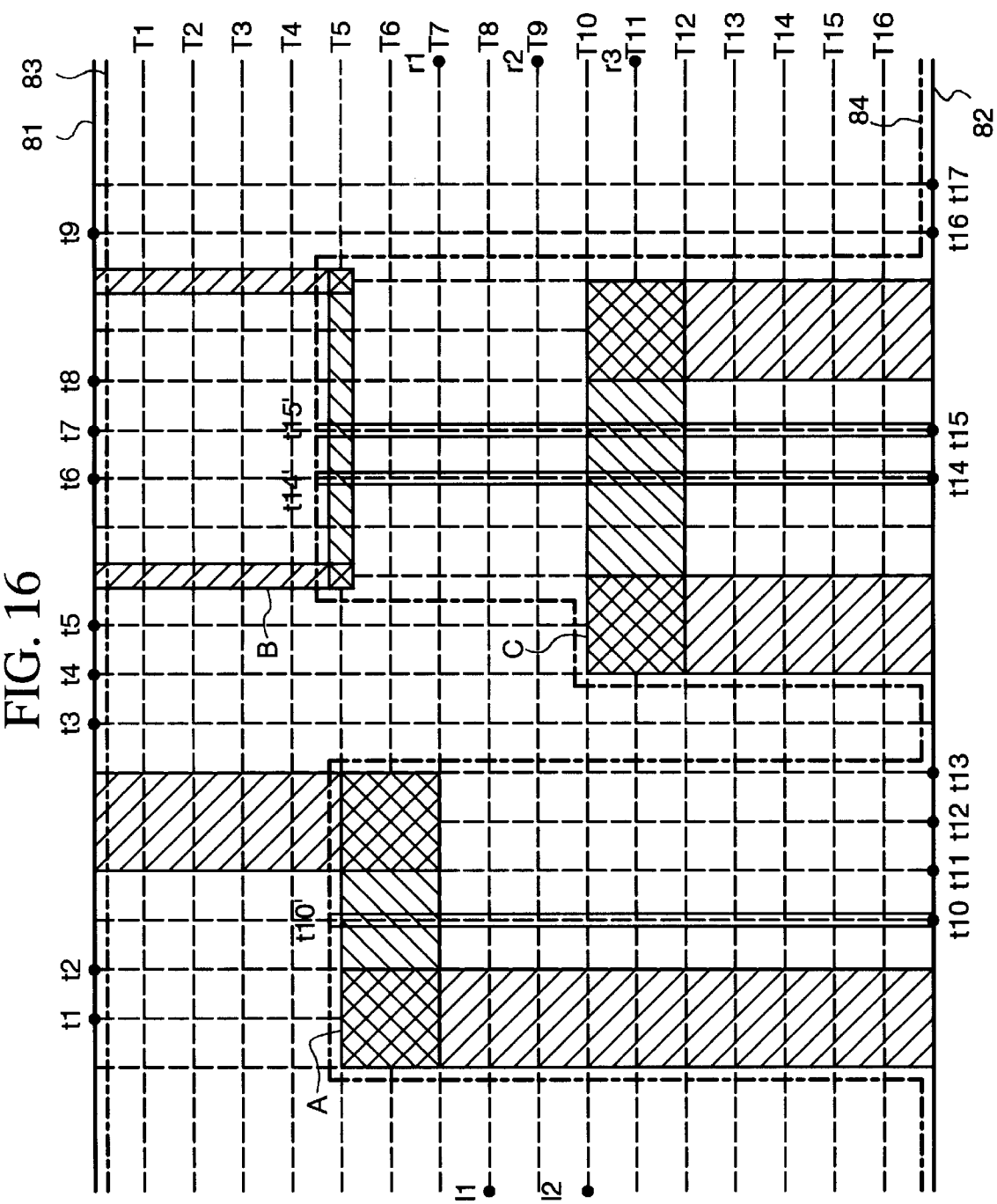
FIG. 16 is a schematic diagram of a channel wiring region showing operation of the second embodiment as well as a diagram showing a partial channel region and a virtual terminal being set.

Based on the above information about the reachable tracks, the partial channel region is arranged according to the same procedure as in the flowchart of FIG. 3 used for the first embodiment. In this embodiment, the area between the boundaries 83 and 84 in FIG. 16 is the partial channel region.

Next, the virtual terminal setting unit 40 sets virtual terminals corresponding to the terminals not in contact with the partial channel region set as above (Step 1403). In this embodiment, virtual terminals t10', t14' and t15', which respectively correspond to the terminals t10, t14 and t15 are set on the boundary of the partial channel as shown in FIG. 16.

Then, the net selecting unit 30 considers all nets having a terminal or a virtual terminal on the partial channel boundary set by the partial channel setting unit 20 for nets as the targets of trunk allocation in the partial channel, and generates a set (S) having these nets as elements (Step 1404). Here, for the wiring inhibited pattern adjacent to the lower boundary 84 of the partial channel, the nets having any wiring inhibited pattern in the trunk section are not included in the set (S). In this embodiment, the trunk section between the nets n3 and n4 contains the wiring inhibited pattern (B) as shown in FIG. 16, and is not selected as an element of the set (S). Thus, the nets in the set (S) proposed for the partial channel contain {n1, n2, n5, n6, n10}.

Next, the trunk allocating unit 50 allocates the trunks of the nets in the set (S) generated by the net selecting unit 30 to the wiring tracks in the partial channel set by the partial channel setting unit 20 according to the procedure below (Step 1405).

Figure 20:
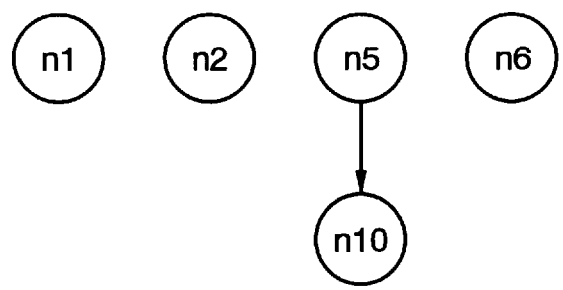
FIG. 20 is a locational restriction graph generated by the operation of the second embodiment for the channel wiring region of FIG. 15.
Figure 26:
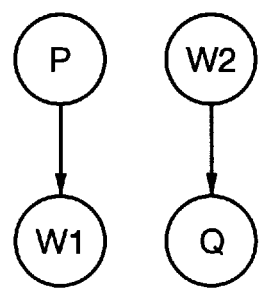
FIG. 26 is a locational restriction graph obtained when a conventional wiring designing method is executed with respect to the channel wiring region of FIG. 24.
Figure 21:
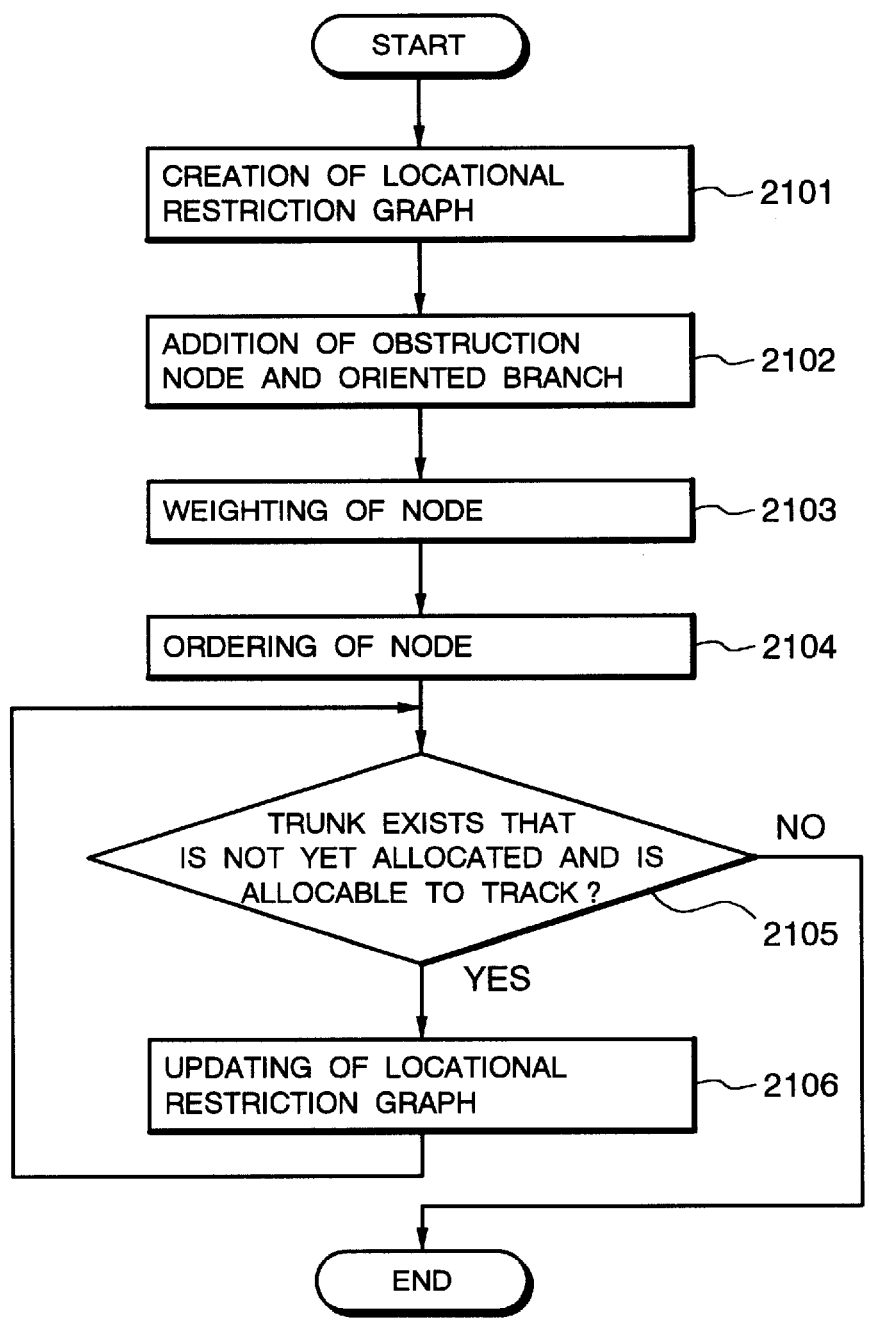
FIG. 21 is a flow chart showing a conventional wiring designing method.
Figure 22:
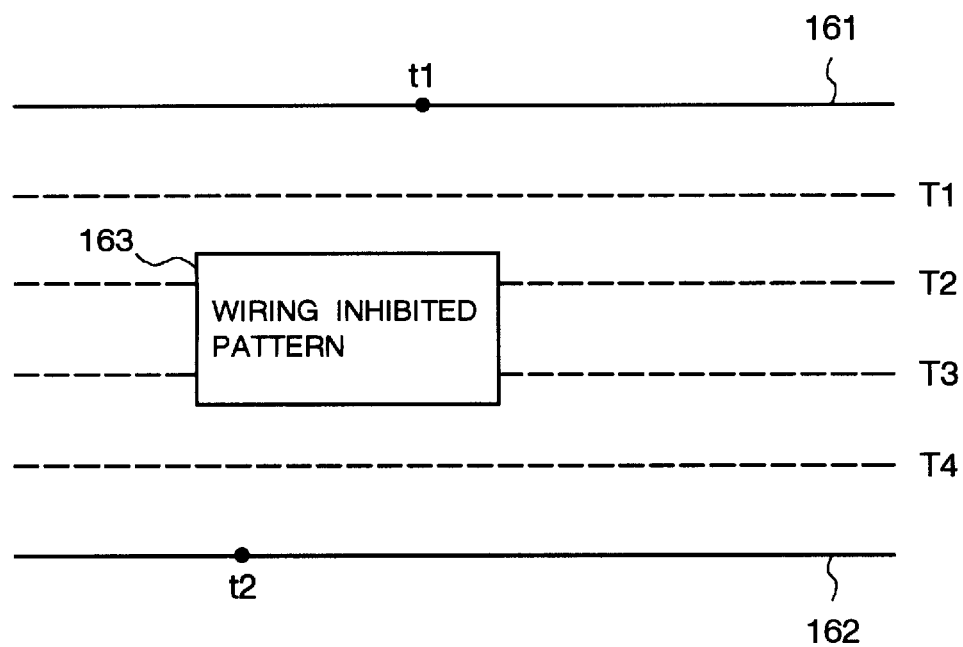
FIG. 22 is a schematic diagram of a channel wiring region showing operation of a conventional wiring designing method.
Figure 23:
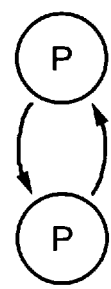
FIG. 23 is a locational restriction graph obtained when a conventional wiring designing method is executed with respect to the channel wiring region of FIG. 22.

Firstly, the upper-lower restriction for the trunks is set for the nets in the set (S) based on the virtual terminal positions. The locational restriction graph illustrating the upper-lower restriction in this embodiment in FIG. 20 shows that no upper-lower restriction exists among the nets n1, n2, n5 and n6 and that the net n10 must be positioned beneath the net n5. The list (L) having the nets in the set (S) arranged in the ascending order of allocation allowability is determined. In this embodiment, the list (L) is as follows:
(L)=(n1=n2, n6, n5, n10).

Then, based on the upper-lower restriction setting and the list (L), the trunks of the nets in the set (S) are allocated to the wiring tracks in the partial channel. Specifically, according to the upper-lower restriction shown in the locational restriction graph in FIG. 11, the trunks of the nets n1 and n5 are allocated to the wiring track T1 at the highest position of the partial channel. To the subsequent wiring track T2, the trunk of the net n2 is allocated according to the order in the list (L). In addition, the trunk of the net n10 is allocated to the same wiring track T2 as that for the net n2. To the wiring track T3, the trunk of the net n6 is allocated.

Next, the wiring inhibited pattern updating unit 60 wires branches from the trunks to terminals using the wiring layer (M2) and registers the wiring results as the wiring inhibited pattern to update the wiring inhibited pattern (Step 1406). By moving the wiring inhibited pattern (A) upward for a distance of "1" (for the width of a single wiring track), it deletes the empty region existing above the wiring inhibited pattern (A). The wiring inhibited pattern (B) is moved to the wiring track T2 having an empty area corresponding to the horizontal section of the wiring inhibited pattern (B).

Figure 17:
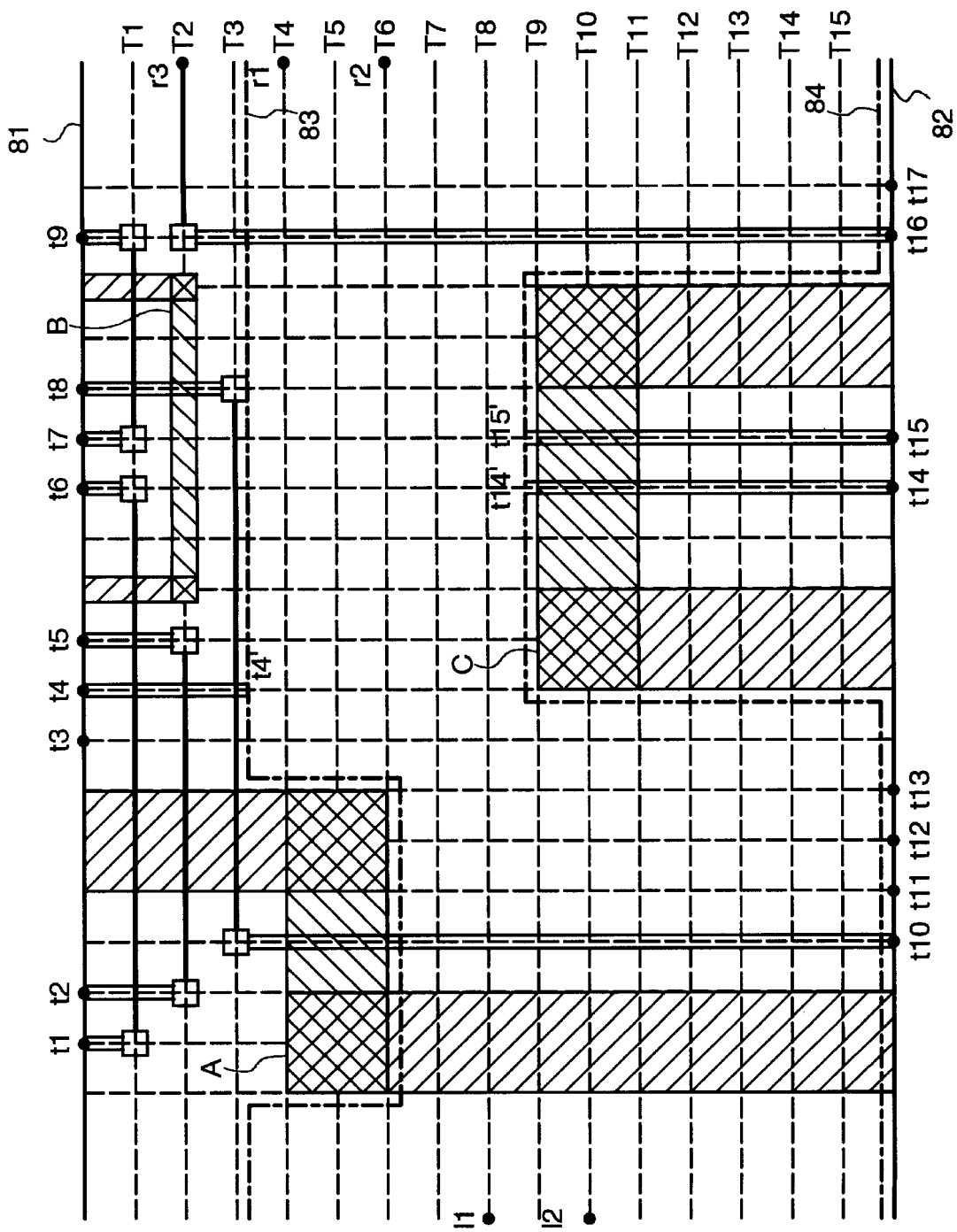
FIG. 17 is a schematic diagram of a channel wiring region showing operation of the second embodiment as well as a diagram showing the state of the first wiring processing being completed.

FIG. 17 shows the status after trunk allocation to the partial channel and transfer of the wiring inhibited pattern as described above. As shown in the figure, trunk allocation has been completed for the trunk of the net n1 connecting the terminals t1 and t6, the trunk of the net n2 connecting the terminals t2 and t5, the trunk of the net n5 connecting the terminals t7 and t9, the trunk of the net n10 connecting the terminals t16 and r3, and the trunk of the net n6 connecting the terminals 8 and 10. The boundaries 83 and 84 in FIG. 17 represent the boundaries of the partial channel region set by the partial channel setting unit 20 in the subsequent processing cycle.

Then, the net list updating unit 70 deletes the nets with the wiring completed from the net list (N) to update the net list (N) (Step 1407). In this embodiment, the nets n1, n2, n5, n6 and n10 are deleted from the net list (N). The updated net list (N) is (N)=(n3, n4, n7, n8, n9).

Finally, the updated net list (N) is checked to see whether the net list is an empty set or not. The above processing is repeated until the net list (N) becomes an empty set (Step 1408). As described above, the net list (N) still contains n3, n4, n7, n8 and n9 now. This means that there are some nets without wiring and the above processing must be repeated from the partial channel setting step (Step 1402).

Figure 18:
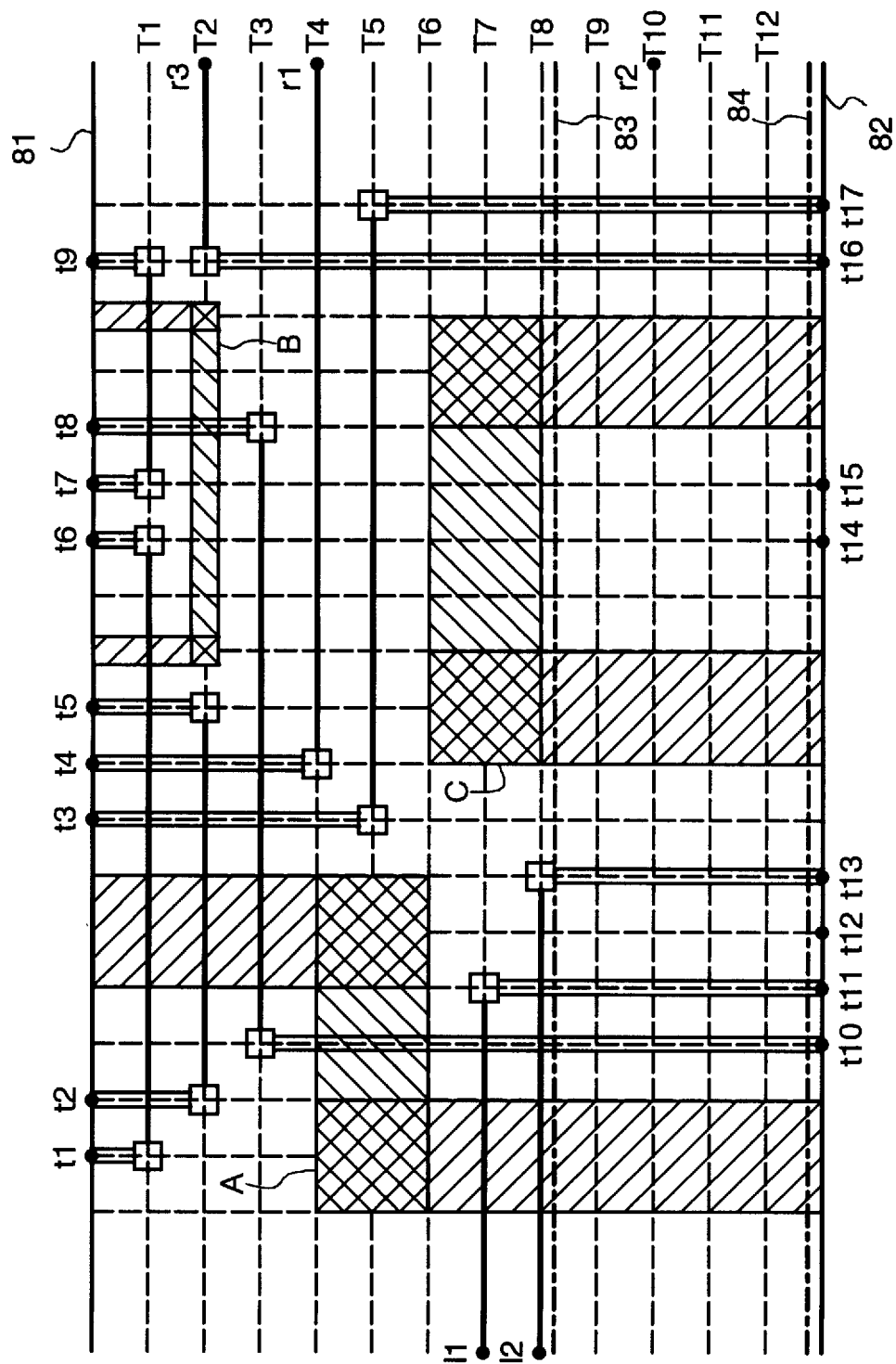
FIG. 18 is a schematic diagram of a channel wiring region showing operation of the second embodiment as well as a diagram showing the state of second wiring processing being completed.

In the second stage of processing, the net set (S) for wiring generated by the net selecting unit 30 is: (S)=(n3, n4, n7 and n9). The trunk section of the net n8 contains the wiring inhibited region C and is not an element of the set (S). The wiring is arranged according to the same procedure as above and the wiring results of FIG. 18 are obtained. As shown in the figure, allocation has been completed for the trunk of the net n3 connecting the terminals t3 and t17, the trunk of the net n4 connecting the terminals t4 and r1, the trunk of the net n7 connecting the terminals l1 and t11, and the trunk of the net n9 connecting the terminals 12 and t13. The boundaries 83 and 84 in FIG. 18 represent the boundaries of the partial channel region set by the partial channel setting unit 20 in the subsequent processing cycle.

Figure 19:
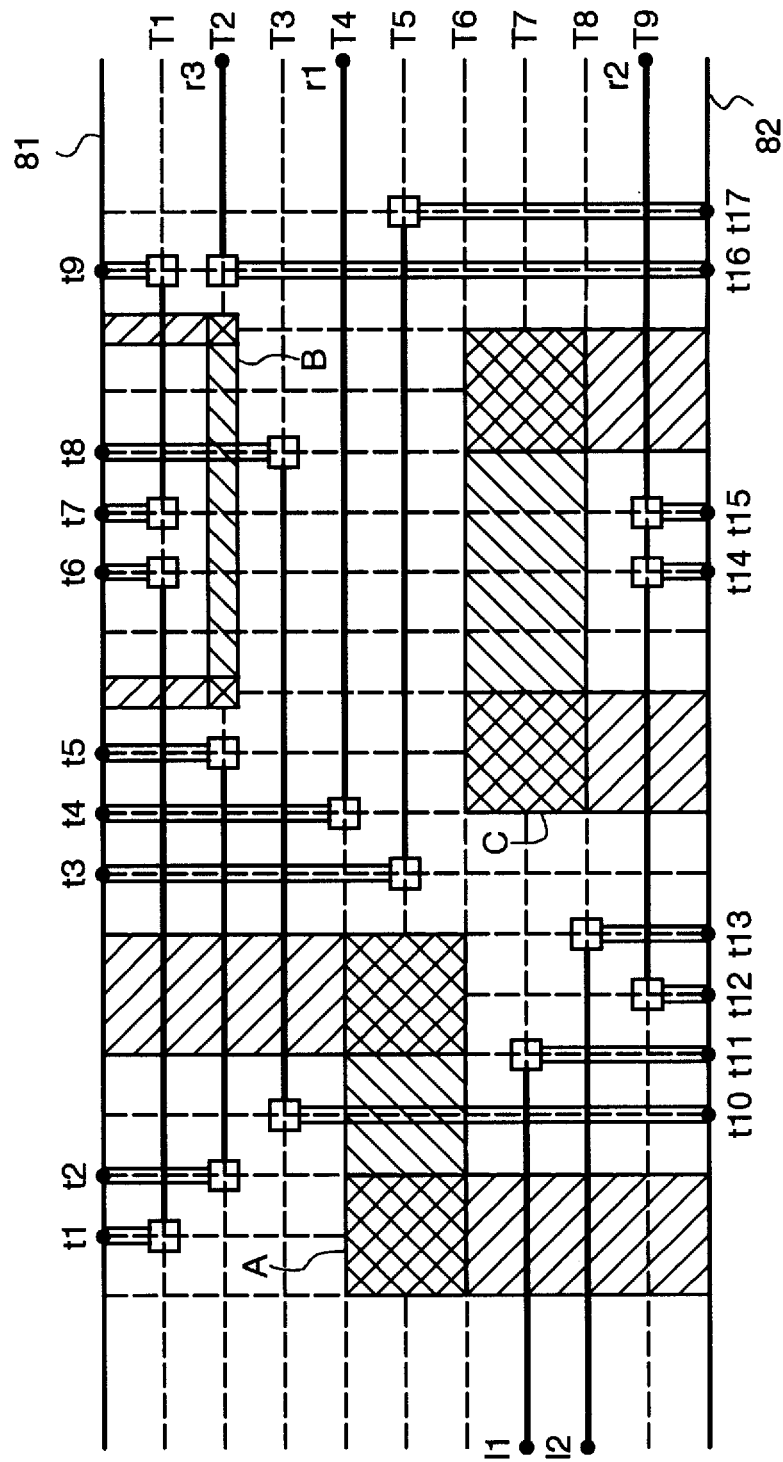
FIG. 19 is a schematic diagram of a channel wiring region showing operation of the second embodiment as well as a diagram showing the state of third wiring processing being completed.

In the third processing, the wiring process is performed according to the same procedure as above and the wiring results of FIG. 19 are obtained. As shown in the figure, allocation has been completed for the trunk of the net n8 connecting the terminals t12 and t14 as well as t15 and r2. Thus, the net list (N) becomes an empty set and the wiring process terminates with all wirings completed.

As described above, the boundaries of the channel wiring region are movable in the direction perpendicular to the boundary line and a wiring inhibited pattern is movable in the direction perpendicular to the channel wiring region boundary while maintaining the relative positional relationship with other wiring inhibited patterns according to this embodiment. This enables wiring for the channel wiring region using minimum area.

Thus, with the wiring designing apparatus and the wiring designing method of the present invention, the efficiency of the wiring track utilization can be improved by setting a partial channel region that contains no wiring inhibited pattern and designing wiring for such a partial channel region considering the shape of the obstructions in the wiring layer of the wiring inhibited pattern.

Wiring designing with the possibility of moving channel wiring region boundaries and wiring inhibited patterns enables wiring for the channel wiring region while using the minimum area. This further improves the utilization efficiency of the wiring tracks.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiments set out above but to include all possible embodiments which can be embodied within the scope encompassed and equivalents thereof with respect to the features set out in the appended claims.

What is claimed is:

1. A wiring designing apparatus for automatically designing a wiring layout on an integrated circuit comprising at least one wiring inhibited pattern, said apparatus comprising:

wiring region setting means for inputting a net list containing nets for terminal connections and to set a channel wiring region for wiring;

partial channel setting means for setting, according to certain rules, a partial channel region that contains no wiring inhibited pattern said partial channel region being set inside said channel wiring region;

net selecting means for selecting target nets for wiring designing from said net list input by said wiring region setting means according to certain rules;

virtual terminal setting means for setting necessary virtual terminals on the boundaries of said partial channel region set by said partial channel setting means for said nets selected by said net selecting means according to certain rules;

trunk allocating means for allocating trunks of said selected nets to wiring tracks in said partial channel region;

wiring inhibited pattern updating means for outputting wiring results and updating at least one wiring inhibited pattern corresponding to the results of the trunk allocation by said trunk allocating means; and net list updating means for updating said net list corresponding to the results of the trunk allocation by said trunk allocating means.

2. A wiring designing apparatus as set forth in claim 1, wherein said partial channel setting means sets said partial channel region by determining, for wiring layers substantially parallel to upper and lower boundaries of the channel wiring region, a maximum region containing no wiring inhibited pattern in a generation direction set by said wiring region setting means.

3. A wiring designing apparatus as set forth in claim 1, wherein said partial channel setting means divides a wiring inhibited pattern which is not square-shaped on the wiring layer as the target of the partial channel region setting into a plurality of squares using straight lines perpendicular to the upper and lower boundaries of said channel wiring region, sets the highest and lowest points on the perpendicular lines extended from the right or left side of the wiring inhibited patterns on said wiring layer according to certain rules, sets the upper and lower sides of a longitudinal region interposing between said two adjacent perpendicular lines based on said highest and lowest points of said vertical lines, and merges all of said longitudinal regions to synthesize and set a single continuous partial channel between the upper and lower sides of the longitudinal region.

4. A wiring designing apparatus as set forth in claim 1, wherein said partial channel setting means sets said partial channel region by determining, for wiring layers substantially parallel to upper and lower boundaries of the channel wiring region, a maximum region containing no wiring inhibited pattern in a generation direction set by said wiring region setting means, and said virtual terminal setting means sets virtual terminals at positions corresponding to connection terminals of a net set selected by said net selecting means on the boundaries of the partial channel region set by said partial channel setting means via a wiring layer which is not a trunk line wiring layer and can pass over the wiring inhibited patterns.

5. A wiring designing apparatus as set forth in claim 1, wherein said wiring region setting means sets said channel wiring region with providing a proper margin for the gaps between the wiring inhibited patterns and the gap between the boundary of said channel wiring region and the wiring inhibited patterns and, based on such gap setting, sets the positions of said wiring inhibited patterns and said channel wiring region boundaries, and said wiring inhibited pattern updating means updates a wiring inhibited pattern with raising the lower boundary of the partial channel by, when there exists a wiring inhibited pattern positioned beneath and adjacent to the lower boundary of the partial channel, moving that wiring inhibited pattern upward as far as possible within the range allowed under the general design rules for semiconductor processors and, when the lower boundary of said partial channel is on the lower boundary of said channel wiring region, by moving the lower boundary of said channel wiring region upward as far as possible within the range allowed under the general design rules for semiconductor processors.

6. A wiring setting apparatus as set forth in claim 1, wherein said partial channel setting means sets said partial channel region by determining, for wiring layers substantially parallel to upper and lower boundaries of the channel wiring region, a maximum region containing no wiring inhibited pattern in a generation direction set by said wiring region setting means, said wiring region setting means sets said channel wiring region while providing a proper margin for gaps between wiring inhibited patterns and a gap between a boundary of said channel wiring region and the wiring inhibited patterns and, based on such gap setting, sets positions of said wiring inhibited patterns and said channel wiring region boundaries, and wherein said wiring inhibited pattern updating means updates at least one wiring inhibited pattern by raising the lower boundary of the partial channel by, when there exists a wiring inhibited pattern positioned beneath and adjacent to the lower boundary of the partial channel, moving that wiring inhibited pattern upward as far as possible within the range allowed under the general design rules for semiconductor processors and, when the lower boundary of said partial channel is on the lower boundary of said channel wiring region, by moving the lower boundary of said channel wiring region upward as far as possible within the range allowed under the general design rules for semiconductor processors.

7. A wiring setting apparatus as set forth in claim 1, wherein said partial channel setting means sets said partial channel region by determining, for wiring layers substantially parallel to horizontal upper and lower boundaries of the channel wiring region, a maximum region containing no wiring inhibited pattern in a generation direction set by said wiring region setting means said virtual terminal setting means sets virtual terminals at positions corresponding to connection terminals of a net set selected by said net selecting means on boundaries of the partial channel region set by said partial channel setting means via a wiring layer which is not a trunk line wiring layer and can pass over the wiring inhibited patterns, said wiring region setting means sets said channel wiring region while providing a proper margin for gaps between wiring inhibited patterns and a gap between a boundary of said channel wiring region and the wiring inhibited patterns and, based on such gap setting, sets the positions of said wiring inhibited patterns and said channel wiring region boundaries, and wherein said wiring inhibited pattern updating means updates at least one wiring inhibited pattern by raising the lower boundary of the partial channel by, when there exists a wiring inhibited pattern positioned beneath and adjacent to the lower boundary of the partial channel, moving that wiring inhibited pattern upward as far as possible within the range allowed under the general design rules for semiconductor processors and, when the lower boundary of said partial channel is on the lower boundary of said channel wiring region, by moving the lower boundary of said channel wiring region upward as far as possible within the range allowed under the general design rules for semiconductor processors.

8. A wiring designing method executed in a wiring designing apparatus for automatically designing a wiring layout on an integrated circuit having at least one wiring inhibited pattern, comprising the steps of:

a first step for inputting a net list containing nets for terminal connections and to set a channel wiring region for wiring;

a second step for setting a partial channel region that contains no wiring inhibited pattern, said partial channel set inside said channel wiring region;

a third step for selecting target nets for wiring designing from said net list input by said wiring region setting means according to certain rules;

a fourth step for setting necessary virtual terminals on the boundaries of said partial channel region set by said partial channel setting means for said nets selected by said net selecting means according to certain rules;

a fifth step for allocating trunks of said selected nets to wiring tracks in said partial channel region;

a sixth step for outputting wiring results and updating at least one wiring inhibited pattern corresponding to the results of the trunk allocation by said trunk allocating means, and a seventh step for updating said net list corresponding to the results of the trunk allocation by said trunk allocating means.

9. A wiring designing method as set forth in claim 8, wherein said second step to set said partial channel region further comprises:

a step for dividing a wiring inhibited pattern which is not square-shaped on the wiring layer as the target of the partial channel region setting into a plurality of squares using straight lines perpendicular to the upper and lower boundaries of said channel wiring region, a step for setting the highest and lowest points on the perpendicular lines extended from the right or left side of the wiring inhibited patterns on said wiring layer according to certain rules, a step for setting the upper and lower sides of a longitudinal region interposing between said two adjacent perpendicular lines based on said highest and lowest points of said vertical lines, and a step for merging all of said longitudinal regions to synthesize and set a single continuous partial channel between the upper and lower sides of the longitudinal region.

10. A wiring designing method as set forth in claim 8, wherein said second step for partial channel setting sets said partial channel region by determining, for wiring layers substantially parallel to upper and lower boundaries of the channel wiring region, a maximum region containing no wiring inhibited pattern in a generation direction set by said wiring region setting means, and said fourth step for virtual terminal setting sets virtual terminals at positions corresponding to the connection terminals of a net set selected by said net selecting means on the boundaries of the partial channel region set by said partial channel setting means via a wiring layer which is not a trunk line wiring layer and can pass over the wiring inhibited patterns.

11. A wiring designing method as set forth in claim 8, wherein said first step for wiring region setting sets said channel wiring region with providing a proper margin for the gaps between the wiring inhibited patterns and the gap between the boundary of said channel wiring region and the wiring inhibited patterns and, based on such gap setting, sets the positions of said wiring inhibited patterns and said channel wiring region boundaries, and said sixth step for updating wiring inhibited patterns updates a wiring inhibited pattern with raising the lower boundary of the partial channel by, when there exists a wiring inhibited pattern positioned beneath and adjacent to the lower boundary of the partial channel, moving that wiring inhibited pattern upward as far as possible within the range allowed under the general design rules for semiconductor processors and, when the lower boundary of said partial channel is on the lower boundary of said channel wiring region, by moving the lower boundary of said channel wiring region upward as far as possible within the range allowed under the general design rules for semiconductor processors.

12. A wiring designing method as set forth in claim 8, wherein said second step for partial channel setting sets said partial channel region by determining for wiring layers substantially parallel to upper and lower boundaries of the channel wiring region, a maximum region containing no wiring inhibited pattern in a generation direction set by said wiring region setting means, said fourth step for virtual terminal setting sets virtual terminals at positions corresponding to the connection terminals of a net set selected by said net selecting means on the boundaries of the partial channel region set by said partial channel setting means via a wiring layer which is not a trunk line wiring layer and can pass over the wiring inhibited patterns, said first step for wiring region setting sets said channel wiring region while providing a proper margin for gaps between wiring inhibited patterns and a gap between the boundary of said channel wiring region and the wiring inhibited patterns and, based on such gap setting, sets the positions of at least one of said wiring inhibited patterns and said channel wiring region boundaries, and said sixth step for updating said wiring inhibited patterns updates at least one wiring inhibited pattern by raising the lower boundary of the partial channel by, when there exists a wiring inhibited pattern positioned beneath and adjacent to the lower boundary of the partial channel, moving that wiring inhibited pattern upward as far as possible within the range allowed under the general design rules for semiconductor processors and, when the lower boundary of said partial channel is on the lower boundary of said channel wiring region, by moving the lower boundary of said channel wiring region upward as far as possible within the range allowed under the general design rules for semiconductor processors.

* * * * *